(12) United States Patent
Nitta et al.

(10) Patent No.: US 6,747,293 B2
(45) Date of Patent: Jun. 8, 2004

(54) LIGHT EMITTING DEVICE

(75) Inventors: Koichi Nitta, Yokohama (JP); Kenji Shimomura, Kitakyushu (JP); Hiroaki Oshio, Kitakyushu (JP); Takeshi Komatsu, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/118,604

(22) Filed: Apr. 8, 2002

(65) Prior Publication Data

US 2002/0190262 A1 Dec. 19, 2002

(30) Foreign Application Priority Data

Apr. 9, 2001 (JP) .................................. 2001-110676

(51) Int. Cl.$^7$ ............................................. H01L 33/00
(52) U.S. Cl. ......................... 257/99; 257/98; 257/100
(58) Field of Search .................. 257/79–103, 666–667, 257/676; 372/43–50

(56) References Cited

U.S. PATENT DOCUMENTS

| | | | |
|---|---|---|---|
| 4,034,466 A | * 7/1977 | Thome ......................... 29/588 |
| 5,430,330 A | 7/1995 | Takahama et al. |
| 5,489,800 A | 2/1996 | Brown et al. |
| 5,763,901 A | 6/1998 | Komoto et al. |
| 5,832,600 A | 11/1998 | Hashimoto |
| 5,841,177 A | * 11/1998 | Komoto et al. ............. 257/431 |
| 5,861,680 A | 1/1999 | Yamanaka |
| 5,907,151 A | * 5/1999 | Gramann et al. ........ 250/214.1 |
| RE36,446 E | 12/1999 | Lumbard et al. |
| 5,998,925 A | 12/1999 | Shimizu et al. |
| RE36,614 E | 3/2000 | Lumbard et al. |
| 6,091,139 A | 7/2000 | Adachi et al. |
| 6,274,890 B1 | 8/2001 | Oshio et al. |
| 6,333,522 B1 | * 12/2001 | Inoue et al. ................... 257/99 |
| 6,340,824 B1 | 1/2002 | Komoto et al. |
| 2001/0024087 A1 | 9/2001 | Suehiro et al. |
| 2002/0158257 A1 | 10/2002 | Nei |

FOREIGN PATENT DOCUMENTS

| | | | |
|---|---|---|---|
| JP | 62-054974 | 3/1987 | |
| JP | 5-21458 | 3/1993 | |
| JP | 08-335720 | 12/1996 | |
| JP | 408330633 A | * 12/1996 | ........... H01L/33/00 |
| JP | 10-319877 | 12/1998 | |
| JP | 02000208818 A | * 7/2000 | ........... H01L/33/00 |
| JP | 2001-077433 | 3/2001 | |

OTHER PUBLICATIONS

U.S. patent application Ser. No. 09/080,300, Oblon, et al., filed Mar. 14, 2000.
U.S. patent application Ser. No. 09/803,457, Oblon, et al., filed Mar. 14, 2000.
U.S. patent application Ser. No. 09/143,905, Oblon, et al., filed Mar. 14, 2000.

\* cited by examiner

*Primary Examiner*—Nathan J. Flynn
*Assistant Examiner*—Johannes P. Mondt
(74) *Attorney, Agent, or Firm*—Hogan & Hartson, LLP

(57) ABSTRACT

A light emitting device includes a plurality of chips efficiently disposed in a limited space of an opening that has an approximately elliptical or elongate-circular opening shape. The device includes a lead having a slit formed between a portion for bonding a wire to and a portion for mounting chips on, thereby to prevent extrusion of an adhesive and eliminate defective bonding.

19 Claims, 22 Drawing Sheets

LIGHT EMITTING DEVICE

CROSS-REFERENCE TO RELATED APPLICATIONS

This application is based upon and claims the benefit of priority from the prior Japanese Patent Application No. 2001-110676, filed on Apr. 9, 2001; the entire contents of which are incorporated herein by reference.

BACKGROUND OF THE INVENTION

This invention relates to a light emitting device, in particular, having an excellent emission property and a high reliability.

Light emitting devices combining LEDs (light emitting diodes) or other semiconductor light emitting elements and fluorescent elements have been remarked as inexpensive, long-lived light emitting devices, and are widely used as various kinds of indicators, light sources, flat-type display devices, backlight of liquid crystal displays, and so forth.

As typical light emitting devices, there are those mounting semiconductors light emitting elements in resin stems.

FIGS. 37A and 37B show such a typical conventional light emitting device. FIG. 37A is a plan view showing a configuration of the substantially part thereof, and FIG. 37B is a cross-sectional view thereof.

The light emitting device shown here is of a so-called "surface mounting" type, including a package (resin stem) 800, semiconductor light emitting element 802 and sealing element 804 of a resin.

The resin stem 800 has a structure molding a pair of leads 805, 806 shaped from lead frames with a resin portion 803 of a thermoplastic resin. The resin portion 803 has an opening 801, and the semiconductor light emitting element 802 is place therein. Then the semiconductor light emitting element 802 is sealed with an epoxy resin 804.

The semiconductor light emitting element 802 is mounted on the lead 806. An electrode (not shown) of the semiconductor light emitting element 802 and the lead 805 are connected to each other by a wire 809. When en electric power is supplied to the semiconductor light emitting element 802 through those two leads 805, 806, the semiconductor light emitting element 802 emits light, and the light is extracted from an emission surface 812 via the epoxy resin 804.

The Inventor, however, made researches and has found that conventional light emitting devices of this type have still room for improvement from the viewpoint of reliability and long-time stability.

That is, through temperature cycle tests of 700 cycles under temperatures in the range from −40° C. to 110° C., various undesirable phenomena were observed, such as cracks C in the epoxy resin 804 as shown in FIG. 38, or exfoliation of the epoxy resin 804 at the interface I with the resin stem 800. In some cases, the semiconductor light emitting element 802 broke, or exfoliated from the mount surface, and the wire 809 cut down.

The light emitting device shown in FIGS. 37A and 37B certainly meets the requirements currently in force, i.e., 100 cycles as the current level of temperature cycle tests requested for ordinary civilian uses, and 300 cycles for car-borne uses. However, for further improvement of the reliability toward the future uses, essential review is required.

The same circumstances commonly exist in all structures sealing semiconductor elements with epoxy resin, without being limited to that shown in FIGS. 37A and 37B.

As a result of a careful review of mechanisms of malfunctions, the Inventor has realized that the epoxy resins 804 is physically hard and fragile and produces a large stress upon hardening and that there still exists room for improvement in quality of close contact with the resin portion 803 of a thermoplastic resin that surrounds it.

Apart from this, there are semiconductor devices of a type as shown in FIGS. 37A and 37B but including two or more chips mounted in the opening 801.

Those having two or more semiconductor elements common in emission wavelength, for example, are enhanced in output.

Those having two or more semiconductor elements different in emission wavelength can provide mixed color, thereby to diversify the color representation. In this case, two complementary colors can produce white light.

It is sometimes desirable to mount an element for protecting the light emitting element in a common package. Incase of a light emitting element of a nitride semiconductor, it is often desirable to connect a Zener diode in a parallel opposite directions for the purpose of protecting the light emitting element from static electricity.

However, the light emitting device shown in FIGS. 37A and 37B cannot provide a sufficient space for mounting the chip and for bonding the wire as well. If two chips are packed in the narrow opening by force, the optical axis of the light emitting element will largely offset from the center of the opening, and the intensity profile of the emitted light, i.e., luminous intensity property, will become asymmetrical. Then, the light emitting device cannot provide a uniform emission pattern required in applications such as the back light of a liquid crystal display.

FIG. 39 is a schematic diagram showing a plan-viewed configuration of a light emitting device prepared by the Inventor for trial toward the present invention.

The light emitting device shown here has an approximately rectangular opening 901 formed in a resin portion 903, and chips 902A, 902B mounted on opposed leads 905, 906, respectively, at the bottom of the opening 901. Wires 909A, 909B extending from the chips 902A, 902B are connected to the opposed leads 906, 905, respectively.

As a result of evaluation of this light emitting device, the following problems were found.

The fist problem is that a part of an adhesive extruding out upon mounting the chips 902A, 902B causes insufficient bonding of the wires 909A, 909B. For mounting the chips 902A, 902B to the leads, pastes such as silver paste or solders such as gold-tin (AuSn) or gold-germanium (AuGe) solder is usually used.

However, such an adhesive often extrudes on the leads 905, 906 upon mounting. If the extruded adhesive reaches the wire bonding region, it makes it difficult to bond wires 909A, 909B by thermo compression bonding or ultrasonic welding. For example, when a silver paste exists, so-called "breeding" occurs, and it makes wire bonding difficult. Even if they are once bonded, their bonding force will soon degrade significantly.

An attempt of locating the wire bonding site remote from the chip for the purpose of preventing that problem will need a larger opening 901 against the restriction on size.

The second problem lies in that the illustrated rectangular shape of the opening 901 causes side walls of the resin portion 903 to be uniformly thin, and makes the mechanical strength insufficient. This problem becomes serious especially when a soft resin is used as the sealing element buried in the opening. For example, a silicone resin used as the sealing element is advantageous for reducing the residual stress and thereby reducing cracks of the sealing element and breakage of the wire. However, in case the side wall of the resin portion 903 is thin, the relatively soft silicone resin often fails to prevent an external lateral force to act on the chip and the wire. For example, upon picking up the light emitting device by grasping from its side surfaces for assembly and a test, the force actually acted upon the chip and the wire, and often deformed the wire.

The third problem is that the illustrated rectangular shape of the opening 901 need a larger quantity of resin buried therein, and sometimes increases the resin stress. The resin filled in the opening 901 produces a stress upon curing, or thereafter upon an increase of decrease of the temperature.

The degree of the stress depends on the buried quantity of the resin, and tends to increase as the buried quantity increases. Moreover, as already explained with reference to FIG. 38, epoxy resins exhibit a large stress.

Therefore, the sealing resin filled in the illustrated rectangular opening 901 produced a large stress, and is liable to cause exfoliation of the chips 902A, 902B, and deformation or breakage of the wires 909A, 909B.

That is, the attempt of mounting two or more chips in the light emitting device invites various problems contravening the requirements about the external dimensions.

As reviewed above, conventional light emitting devices were not suitable for mounting a plurality of chips, and had room for improvement from the viewpoint of reliability as well.

SUMMARY OF THE INVENTION

According to an embodiment of the invention, there is provided a light emitting device comprising: a resin portion having an opening, said opening having an approximately elliptical or elongate-circular opening shape; a first semiconductor light emitting element disposed inside said opening; a semiconductor element disposed inside said opening; and a silicone resin provided inside said opening to enclose said first semiconductor light emitting element and said semiconductor element, said silicone resin having a hardness not lower than 50 in JISA value.

According to another embodiment of the invention, there is provided another light emitting device comprising: a lead; a resin portion embedding at least a part of said lead; a first semiconductor light emitting element mounted on said lead in an opening formed in said resin portion; a semiconductor element mounted on said lead in said opening; a wire connecting said first semiconductor light emitting element and said lead; and a silicone resin provided in said opening to enclose said first semiconductor light emitting element and said semiconductor element, said silicone resin having a hardness not lower than 50 in JISA value, said lead having a slit formed therein between a portion where said first semiconductor light emitting element is mounted and a portion where said wire is connected.

According to another embodiment of the invention, there is provided another light emitting device comprising: a first lead; a second lead; a resin portion embedding at least a part of said first and second leads; a first semiconductor light emitting element mounted on said first lead in an opening formed in said resin portion; a semiconductor element mounted on said second lead in said opening; a first wire connecting said first semiconductor light emitting element and said second lead; a second wire connecting said semiconductor element and said first lead; and a silicone resin provided in said opening to enclose said first semiconductor light emitting element and said semiconductor element, said silicone resin having a hardness not lower than 50 in JISA value, said first lead having a first slit formed therein between a portion where said first semiconductor light emitting element is mounted and a portion where said second wire is connected, said second lead having a second slit formed therein between a portion where said semiconductor element is mounted and a portion where said first wire is connected.

According to another embodiment of the invention, there is provided another light emitting device comprising: a first lead; a second lead; a resin portion embedding at least a part of said first and second leads; a first semiconductor light emitting element mounted on said first lead in an opening formed in said resin portion; a semiconductor element mounted on said first lead in said opening; a first wire connecting said first semiconductor light emitting element and said second lead; a second wire connecting said semiconductor element and said second lead; and a silicone resin provided in said opening to enclose said first semiconductor light emitting element and said semiconductor element, said silicone resin having a hardness not lower than 50 in JISA value, said opening having a substantially elliptical or elongate-circular opening shape, said first semiconductor light emitting element and said semiconductor element being arranged along a longer axis or a shorter axis of said elliptical or elongate-circular opening.

According to another embodiment of the invention, there is provided another light emitting device comprising: a semiconductor element; a first semiconductor light emitting element mounted on said semiconductor element by a metal bump; a silicone resin provided to enclose said semiconductor element and said first semiconductor light emitting element, said silicone resin having a hardness not lower than 50 in JISA value.

According to another embodiment of the invention, there is provided another light emitting device comprising: a semiconductor light emitting element; a silicone resin provided to enclose said semiconductor light emitting element, said silicone resin having a hardness not lower than 50 in JISA value; and a fluorescent element which is included in said silicone resin, absorbs light emitted from said semiconductor light emitting element and releases light of a peak wavelength different from said light from said semiconductor light emitting element.

In the present application, the "elongate-circle" means a shape connecting a pair of curved portions by a pair of substantially straight portions. The curved portions may be either regularly arc-shaped or irregularly arc-shaped.

The present application contemplates, with the term "silicone resin", any resin having as its skeleton a structure in which silicon atoms having organic radicals such as alkyl radicals or aryl radicals are alternately connected to oxygen atoms. Needless to say, those containing additive elements added to such skeletons are also included in "silicone resins".

In the present application, the "fluorescent element" may be any having a wavelength converting function, either inorganic or organic, including inorganic dyes having a wavelength converting function.

BRIEF DESCRIPTION OF THE DRAWINGS

The present invention will be understood more fully from the detailed description given herebelow and from the accompanying drawings of the embodiments of the invention. However, the drawings are not intended to imply limitation of the invention to a specific embodiment, but are for explanation and understanding only.

In the drawings:

FIGS. 1A and 1B show schematic diagrams illustrating a configuration of the substantial part of a light emitting device according to the first embodiment of the invention, in which FIG. 1A is a plan view and FIG. 1B is a cross-sectional view taken along the A—A line of FIG. 1A;

FIGS. 23A through 23C show diagrams that schematically show intensity profiles of emitted light depending on the surface configuration of the sealing element, in which FIG. 23A shows the intensity profile P of light from the light emitting element using a sealing element 111 having a flat surface configuration, FIG. 23B shows that with a sealing element 111 having a concave surface configuration, and FIG. 23C shows that with a sealing element 111 having a convex surface configuration;

FIGS. 37A and 37B show schematic diagrams of a typical conventional light emitting device, in which FIG. 37A is a plan view illustrating its substantial part, and FIG. 37B is a cross-sectional view thereof;

DETAILED DESCRIPTION OF THE INVENTION

Some embodiments of the invention will now be explained below with reference to the drawings.

(First Embodiment)

As the first embodiment of the invention, here is taken a light emitting device using a silicone resin as the material of a sealing element and having a unique layout pattern of chips.

Figure 1A:
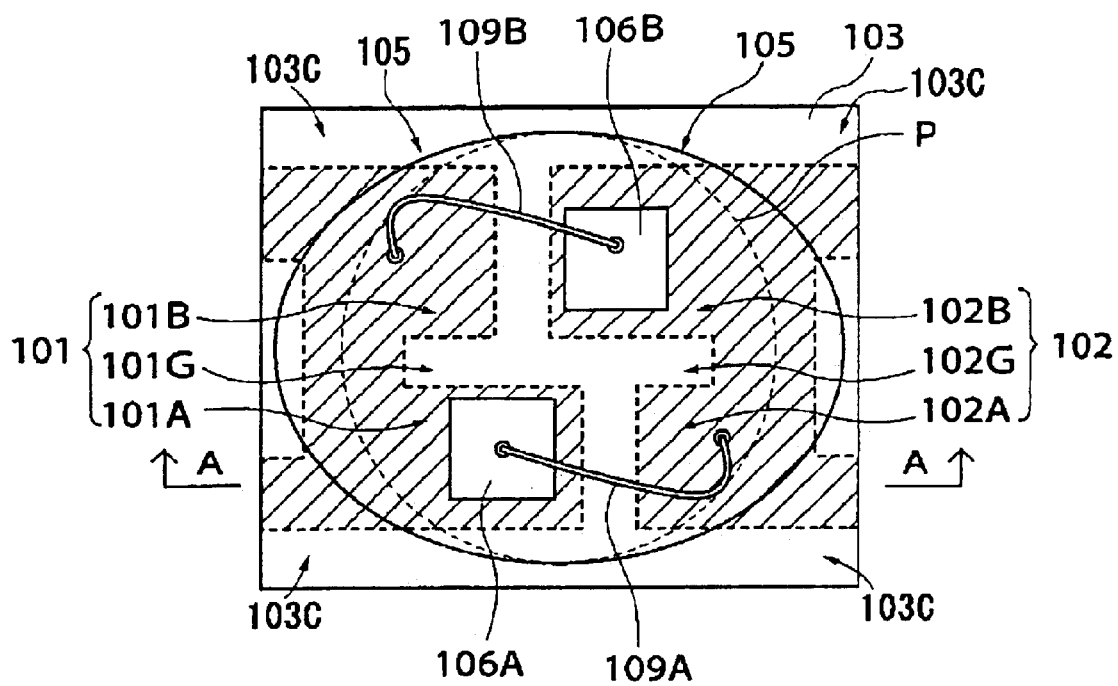
Figure 1B:
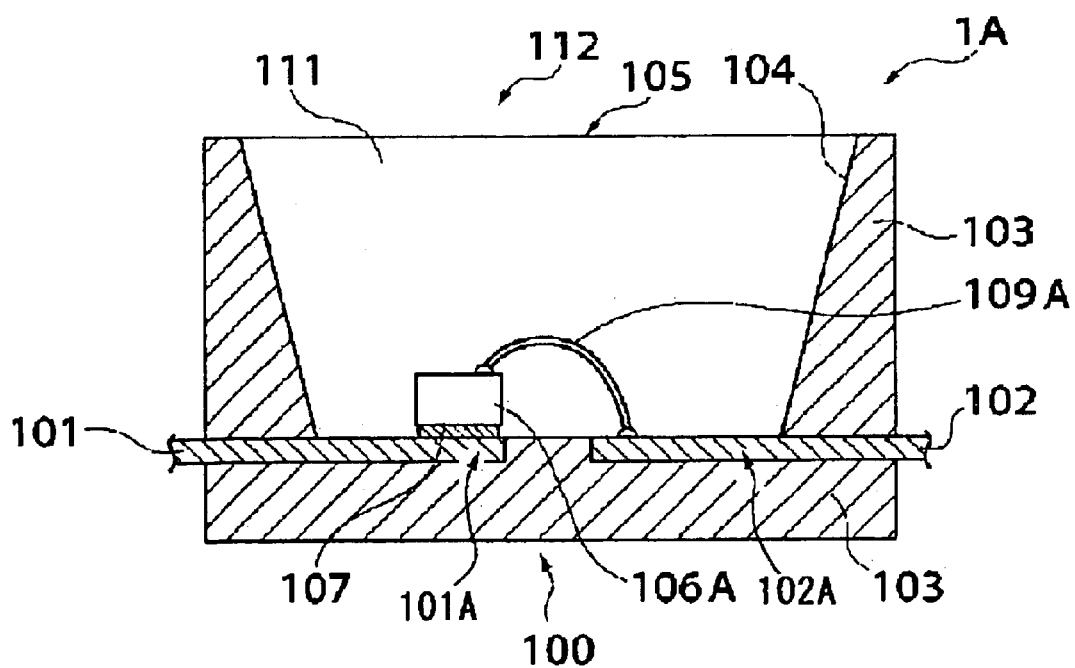

FIGS. 1A and 1B show schematic diagrams illustrating a configuration of the substantial part of a light emitting device according to the first embodiment of the invention, in which FIG. 1A is a plan view and FIG. 1B is a cross-sectional view taken along the A—A line of FIG. 1A.

The light emitting device 1A shown here includes a resin stem 100, a semiconductor light emitting element 106A mounted on the resin stem 100, a protective Zener diode 106B and a sealing element 111 provided to embed them.

The resin stem 100 includes leads 101, 102 shaped from a lead frame, and a resin portion 103 molded integrally with the leads 101, 102.

The resin portion 103 is typically made of a thermoplastic resin preferably, for example, of a nylon system having inert coupling radicals.

The thermoplastic resin may be a resin having a high resistance to heat, such as liquid crystal polymer (LCP), polyphenylene sulfide (PPS: thermoplastic resin) or syndiotactic polystyrene (SPS: crystalline polystyrene). The plan-viewed outer configuration of the resin portion 103 may be a substantial square approximately sized 2.0×2.0 mm through 6.0×6.0 mm, or a substantial rectangular approximately sized 2.0×3.0 mm through 5.0×7.0 mm.

The leads 101, 102 have opposed ends close to each other, and extend therefrom in the opposite directions to outside the resin portion 103.

The resin portion 103 has formed an opening 105, and the semiconductor light emitting element 106A and the diode 106B are mounted at the bottom of the opening 105. The plan-viewed shape of the opening 105 is approximately elliptical or approximately elongate-circular as illustrated. The inner wall surface of the resin portion 103 surrounding the elements 106A, 106B inclines to face toward the light extraction direction to function as a reflective surface 104 for reflecting light.

The light emitting device shown in FIGS. 1A and 1B is characterized in (1) the material of the sealing element 111, (2) shape of the opening 105 and (3) layout of the leads and the chips in the opening 105.

Among these features, the material of the sealing element 111 is explained below in greater detail.

The invention uses a silicone resin instead of a conventional epoxy resin as the sealing element 111 filling the opening 105.

As compared with epoxy resins, silicone resins are less fragile and less subjected to cracks. Silicone resins usable in the present invention exhibit a high bonding force with the resin portion 103 made of a thermoplastic resin, for example, and a high moisture resistance. Additionally, they do not crack or exfoliate so much due to a temperature stress. Furthermore, such a silicone resin filled in the opening produces only a remarkably small resin stress to the light emitting element 106A and the Au wire 109. Moreover, silicone resins are more resistance to light irradiated from the light emitting element 106A than epoxy resins.

The Inventors further developed researches from those viewpoints. As a result, it has been found that the use of "rubber-like" silicone resin having a high hardness leads to an excellent result. Hardness of ordinary silicone resins ranges from 30 to 40 in JISA hardness value that is the hardness of the JIS standard. These silicone resins exhibit gel-like physical properties, and are physically soft. These silicone resins are hereinbelow called "gel-like silicone resins".

In contrast, "rubber-like silicone resins" have a JISA hardness in the range of approximately 50 to 90. Epoxy resins widely used as the sealing element materials in conventional light emitting devices have a JISA hardness around 95.

The Inventors compared and reviewed both "rubber-like silicone resins" and "gel-like silicone resins", and has got the following knowledge.

(1) Light emitting devices of the type shown in FIGS. 1A and 1B normally need the process of soldering, called "reflow", for fixing outwardly projecting portions of the leads 101, 102 (called "outer leads", for example) to a packaging substrate locally covered with a solder. In that process using heat, gel-like silicone resins inevitably become soft, and actually, they often exfoliated at the interface with the resin portion 103.

In contrast, those phenomena did not occur with rubber-like silicone resins, and light emitting devices stably operated even under the temperature condition beyond 110° C.

(2) Since gel-like silicone resins are soft, although the stress they give to the light emitting element 106A and the wires 109A, 109B is small, they are weak against the external force. That is, the light emitting device as shown in FIGS. 1A and 1B is used as a "surface-mounting type" lamp, for example, and mounted on a packaging substrate with an assembly apparatus. In this process, a vacuum collet of the assembly apparatus is often pressed against the surface of the sealing element 111. In case a gel-like silicone resin having a JISA hardness in the range of 30 to 40 is used, the sealing element 111 may be deformed by the pressing force from the vacuum collet, which in turn may deform the wires 109A, 109B or give a stress to the light emitting element 106A (and/or diode 106B).

In contrast, rubber-like silicone resins having a JISA hardness in the range of 50 to 90 are prevented from deformation by a selector or an assembler used for selecting or assembling light emitting devices.

As explained in Paragraphs (1) and (2) above, the Inventors have confirmed that the use of a rubber-like silicone resin instead of a gel-like silicone resin can remarkably improve the emission characteristics, reliability, mechanical strength, and so forth.

A technique for increasing the hardness of a silicone resin is to add an agent for giving a thixotropy index.

Upon burying a silicone resin, it is poured into the opening 105 of the resin stem through a thin nozzle, and thereafter cured. In this process, it is preferable to use a silicone resin having a pre-curing viscosity around 100 cp through 10000 cp. Thereby, it is possible to fully bury the opening including narrow spaces and to limit the residual stress upon curing within a sufficiently low range, without giving an excessive stress to the light emitting element 106A (diode 109B) and the wire 109A (109B).

Based on the knowledge reviewed above, the Inventor prepared light emitting devices according to the embodiment as shown in FIGS. 1A and 1B by using a rubber-like silicone resin having the pre-during viscosity of 1000 cp and post-curing JISA hardness value of 70, and carried out a temperature cycle test in the temperature range from −40° C. to 110° C. As a result, there occurred absolutely no problems of cracks or exfoliation of the sealing element 111 of a silicone resin, breakage or exfoliation of the light emitting element 106A (diode 109B), breakage of the wire 109A (109B), etc. The temperature cycle test is still continued at the time of filing of the present application.

The Inventor also prepared light emitting devices using epoxy resins, and carried similar evaluation. As a result, epoxy resins cracked near 700 cycles. In this manner, the devices using silicone resins have been confirmed to be greatly improved in reliability as compared to those using epoxy resins.

The Inventor also carried out quantitative analysis of the stress applied to the semiconductor light emitting element with devices using silicone resins and devices using epoxy resins, respectively.

Light emitting devices taken for the analysis were prepared by forming a 0.9 mm deep, 2.4 mm diameter, circular opening in the resin portion 103 of the package, mounting a semiconductor light emitting element 106 at the bottom of the opening, and burying a silicone resin of the JISA hardness of 70. Devices as comparative examples were prepared by burying an epoxy resin in the similar structure. In both types of light emitting devices, the semiconductor light emitting element had the size of 200×200 $\mu$m and the thickness of 150 $\mu$m.

While heating and maintaining those light emitting devices at 240° C., stress applied to the semiconductor light emitting element was analyzed at four corners (point A) of the top surface thereof (light emitting surface) and four corners (point B) of the bottom surface thereof (mounting surface). Its result is shown below.

| Resin | Elastic Modulus (MPa) | Stress at 240 (MPa) Point A | Point B |
|---|---|---|---|
| Epoxy resin | 2372 | $3.5 \times 10^{-6}$ | $1.1 \times 10^{-6}$ |
| Silicone resin | 48 | $1.7 \times 10^{-6}$ | $7.8 \times 10^{-6}$ |

The temperature of 240° C. is the peak temperature that may be applied when the light emitting device is fixed to a packaging substrate, for example, by reflow of a solder. As shown, when the light emitting device is heated, a stress corresponding to the thermal expansion of the resin is applied to the light emitting element.

The stress level of $3.5 \times 10^{-6}$ produced in the epoxy resin is the level where breakage of wire will occur before 1000 cycles approximately in the temperature cycle test in the temperature range of −40° C. to 110° C., according to the statistics of the reliability test carried out by the Inventor.

In case of the silicone resin, the stress applied to the light emitting element is about a half the stress given by the epoxy resin. Such a small stress is assumed to be the reason of realizing the remarkably high reliability by eliminating cracks of the resin, exfoliation of the light emitting element, deformation or breakage of wires, and absolutely eliminating malfunctions even in the temperature cycle of 1500 cycles.

As explained above, it has been confirmed that the use of a silicone resin, in particular, a rubber-like silicone resin, reduces the possibility of cracks and exfoliation that often occurred in conventional epoxy resins, breakage of wires, and so on.

The use of a silicone resin also improves the durability against light emitted from the semiconductor light emitting element 106 or light intruding from the exterior of the light emitting device. Epoxy resins change in color when exposed to light, and even if it is initially transparent, its optical transmittance decreases after long-time use.

This phenomenon is magnified as the wavelength of light becomes shorter. For example, in case the epoxy resin is exposed to ultraviolet rays, the originally transparent epoxy resin changes in color through yellow, liver to black. It may result in a serious decrease of the light extraction efficiency. Ultraviolet rays may intrude from the exterior of the light emitting device.

Through trials and reviews, the Inventor has found that the use of silicone resin leads to a very satisfactory result. That is, if a silicone resin is used, change or color and other types of deterioration do not occur even after it is exposed to short wavelength light such as ultraviolet rays. Therefore, silicone resins contribute to realization of light emitting devices exhibiting excellent resistance to light and weather.

In the light emitting device shown in FIGS. 1A and 1B, the resin portion 103 may be equipped with optical reflectivity. For example, the resin portion 103 may be made of 65 or more weight % of a thermoplastic resin and 35 or less weight % of a filling agent. The filling agent contains a high-reflective material such as titanium oxide ($TiO_3$), silicon oxide, aluminum oxide, silica or alumina. In case of titanium oxide, its content is in the range from 10 to 15%. Because the reflective surface 104 is a part of the resin portion containing a diffusing material that reflects light, it can reflect light from the light emitting element 106 and the fluorescent element 110 upward to realize a high luminance of the light emitting device. If the reflective surface 104 is configured as a paraboloid of revolution, for example, the output and the quality of the light emitting device can be further improved.

The sealing element 111 of a silicone resin may also contain such a diffusing material diffused therein to expand the luminous distribution property broader.

Heretofore, detailed explanation has been made about materials of the sealing element 111.

Next made is detailed explanation about the shape of the opening 105 and the layout of leads and chips therein.

In the light emitting device shown in FIGS. 1A and 1B, the opening 105 is approximately elliptical.

In the opening 105, the lead 101 and the lead 102 are isolated. Near the distal end of the lead 101, a slit 101G is formed to divide it into the regions 101A and 101B. Similarly, near the distal end of the lead 102, a slit 102G is formed to divide it into the regions 102A and 102B.

The light emitting element 106A is mounted in the region 101A with an adhesive such as silver (Ag) paste. The light emitting element 106B is mounted in the region 102B similarly with an adhesive 107 such as silver (Ag) paste.

From an electrode (not shown) formed on the light emitting element 106A, the wire 109A is connected to the opposed region 102A. From an electrode (not shown) formed on the diode 106B, the wire 109B is connected to the opposed region 101B.

The configuration explained above provides the following effects.

The slits 101G, 102G formed near distal ends of the leads 101, 102 separate each of them into the portion (101A, 102B) for mounting the chips 106A, 106B and the portion (101B, 102A) for bonding the wires 109A, 109B. This configuration keeps the portion for bonding the wire clean even when silver paste, for example, extrudes upon mounting the chip, and thereby eliminates defective bonding of wires.

Since the invention employs a shape with a longer diameter and a shorter diameter such as an approximately elliptical shape or an approximately elongate-circular shape as the shape of the opening in lieu of an approximately circular shape as shown by a broken line in FIG. 1A, which has been used conventionally, it is possible to effectively increase the area of the opening 105 and thereby make an ample space for mounting two or more chips and bonding the wires.

The approximately elliptical or elongate-circular shape of the opening according to the invention makes it easy to locate the light emitting element closest to the center of the opening.

The use of the approximately elliptical or elongate-circular shape of the opening according to the invention also enables the corner portions 103C to be made thicker. As a result, the light emitting device maintains a sufficient mechanical strength, and it is prevented from deformation or wires and other kinds of damage even upon application of a lateral force during assembly or tests.

Figure 39:
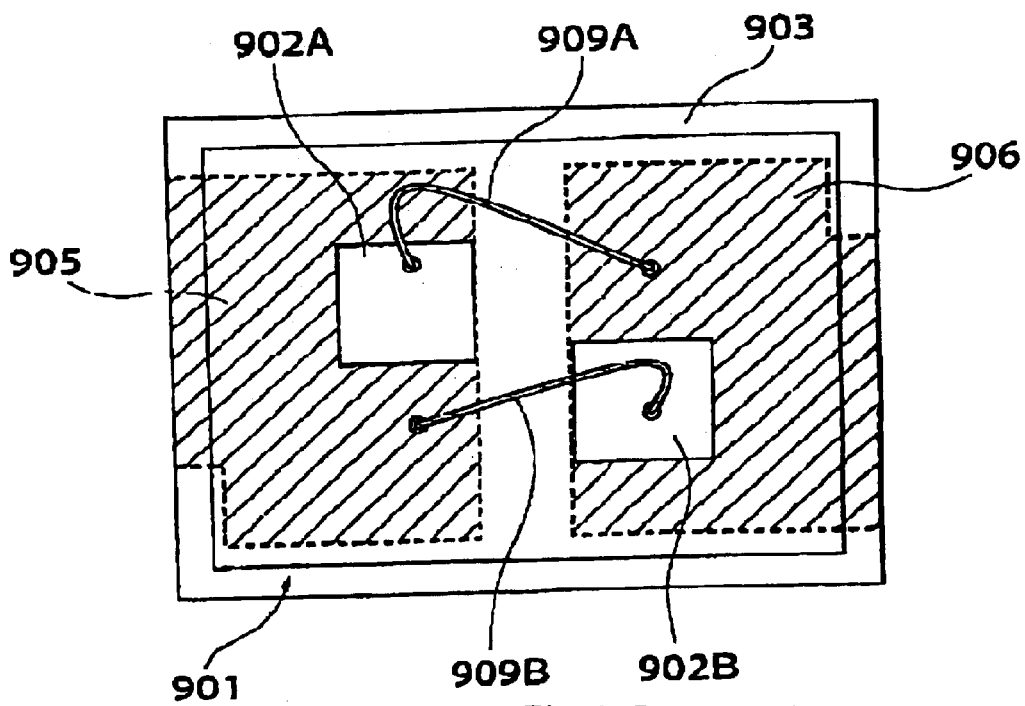
FIG. 39 is a schematic diagram that shows a plan-viewed configuration of a light emitting device prepared by the inventor in trials toward the present invention.

Furthermore, the approximately elliptical or elongate-circular shape of the opening prevents an increase of the resin quantity filled inside and thereby prevents the resin stress. As already explained with reference to FIG. 39, the resin stress increases as the quantity of resin filled as the sealing element 111 increases. The invention, however, minimizes the increase of the resin quantity and simultaneously keeps an ample space for locating a plurality of chips. It results in eliminating the problems of exfoliation of chips, deformation or breakage of wires due to an increase of the resin stress. This effect is obtained as an additional effect by the use of a silicone resin as the sealing element 111.

Moreover, the invention enables mounting of a plurality of chips while maintaining the outer dimension of the light emitting device compact. Therefore, by connecting the protective diode 106B in a parallel, opposite direction from the light emitting element 106A as illustrated, the invention can improve the reliability. In addition, by combining light emitting elements different in emission wavelength, the device can realize emission of white and other various colors, which has been difficult to emit conventionally.

The slits 101G, 102G formed in the leads 101, 102 facilitate corners of the lead patterns to be cognized inside the opening in the process of mounting chips or bonding wires. Therefore, the invention ensures more accurate mounting positions of the chips and more accurate bonding positions of the wires than conventional techniques.

Heretofore, materials of the sealing element 111, shapes of the opening 105 and layout patterns inside the opening 105 of the light emitting device according to the first embodiment have been explained with reference to FIGS. 1A and 1B.

Next explained are greater details of individual components of the light emitting device according to the invention.

Figure 2:
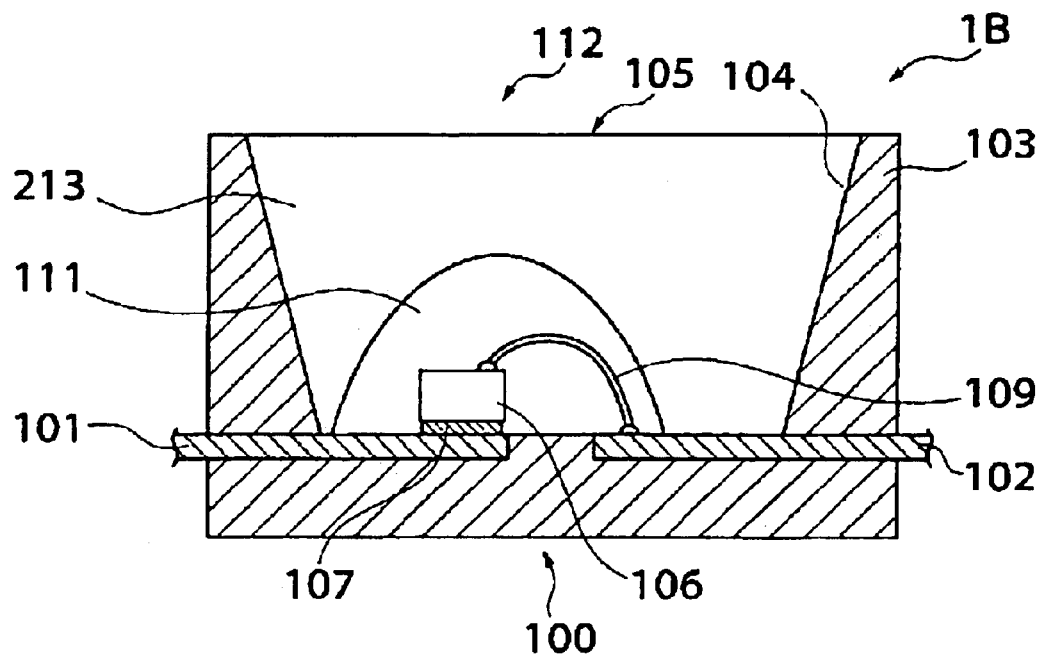
FIG. 2 is a cross-sectional view that schematically shows the second specific example regarding a sealing element 111 in the light emitting device according to the first embodiment.
Figure 3:
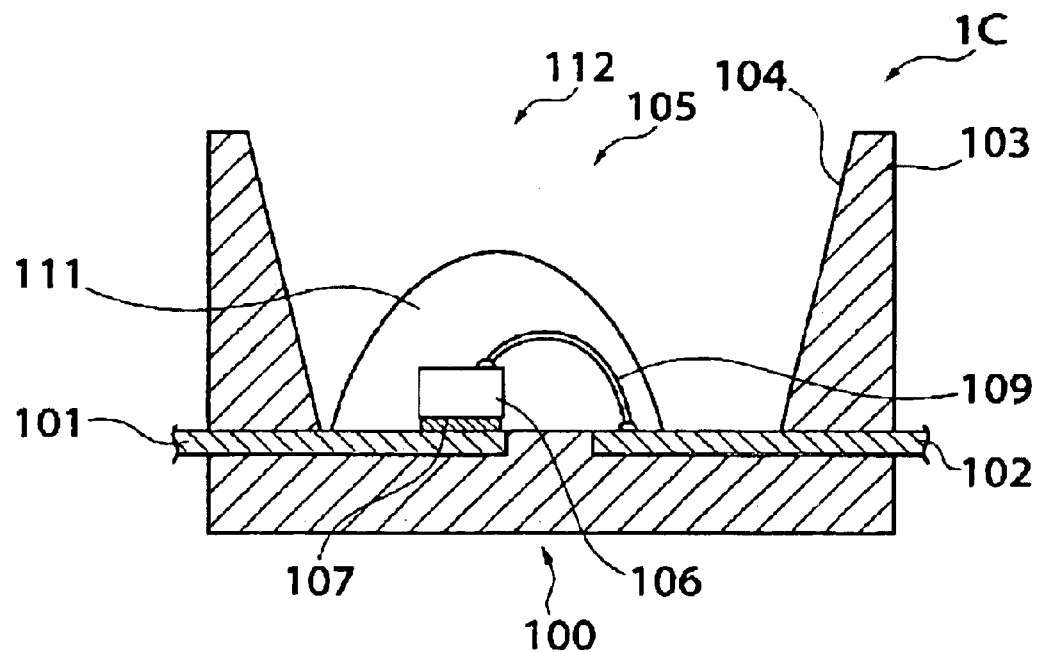
FIG. 3 is a cross-sectional view that schematically shows the third specific example of the light emitting device according to the first embodiment.
Figure 4:
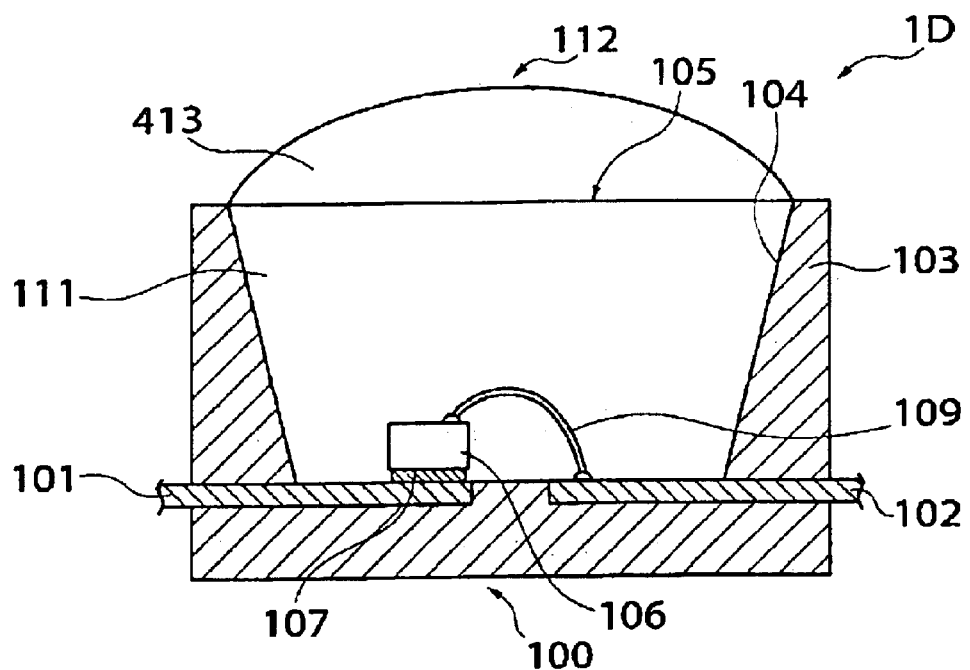
FIG. 4 is a cross-sectional view that schematically shows the fourth specific example of the light emitting device according to the first embodiment.

Referring to FIGS. 2 through 4, modifications regarding the sealing element 111 will be explained.

FIG. 2 is a cross-sectional view that schematically shows the second specific example regarding a sealing element 111 in the light emitting device according to the first embodiment. Among components shown here, the same or equivalent components as those already explained with reference to FIGS. 1A and 1B are commonly labeled, and their detailed explanation is omitted for simplicity.

The light emitting device 1B shown here also includes a resin stem 100, semiconductor light emitting element 106 mounted thereon, and sealing element 111 of a silicone resin provided to embed the element 106.

In this embodiment, however, the sealing element 111 merely embeds the light emitting element 106, and a second sealing element 213 of a transparent resin is provided outside the sealing element 111.

The second sealing element 213 may be made of an epoxy resin, silicone resin or any of other various materials. The second sealing element 213 may be colored, and any material adaptable to the dye or coloring agent used can be selected.

The second sealing element 213 may contain a diffusing material dispersed therein to scatter light. In this case, light can be diffused, and broader light distribution characteristics can be obtained.

If a silicone resin is used as the second sealing element 213, then its close contact with the sealing element 111 is enhanced, and the moisture resistance is improved.

In this specific example, the sealing element 111 made of a silicone resin wraps the entirety of the Au wire 109. Therefore, a reliable light emitting element free from breakage of wire due to a resin stress can be realized. If the wire partly projects into the second sealing element 213, it will readily break due to a stress produced at the interface between the sealing elements 111, 213. In this specific example, however, since the wire 109 is entirely embedded by the sealing element 111, it is free from breakage.

FIG. 3 is a cross-sectional view that schematically shows the third specific example regarding the sealing element 111 in the light emitting device according to the first embodiment. Here again, the same or equivalent components as those already explained with reference to FIGS. 1A, 1B and 2 are commonly labeled, and their detailed explanation is omitted for simplicity.

The light emitting device 1C shown here also includes a resin stem 100, semiconductor light emitting element 106 mounted thereon, and sealing element 111 provided to embed the element 106.

Similarly to the second specific example, the sealing element 111 merely embeds the light emitting element 106. In this specific example, however, the space outside the sealing element 111 remains open, without being filled by any other sealing element.

Here again, the limitative use of the sealing element 111 only to enclose the light emitting element 106 mounted at the bottom of the opening 105 contributes to small-sizing the emitting portion. Therefore, the luminance increases, and the function of the reflective surface 104 to gather rays of light is enhanced.

Especially, in the instant specific example, since the approximately hemispheric sealing element 111 serves as the emission point, and the reflective surface 104 surrounds it, the same optically converging effect as a conventional lamp can be obtained.

Furthermore, similarly to the second specific example, since the sealing element 111 embeds the entirety of the Au wires 108, 109, it prevents breakage of wire by a resin stress, and ensures a high reliability.

FIG. 4 is a cross-sectional view that schematically shows the fourth specific example regarding the sealing element 111 in the light emitting device according to the first embodiment.

Similarly to the first specific example, the light emitting device 1D shown here also includes a resin stem 100, semiconductor light emitting element 106 mounted thereon, and sealing element 111 embedding the element 106.

The embodiment shown here includes a convex transparent element 413 is provided on the sealing element 111 to ensure the function of gathering rays of light. The transparent element 413 may be made of a resin, for example. Especially, a silicone resin is advantageous for decreasing the difference of the refractive index from the sealing element 111 and to reduce the loss by reflection at the interface with the sealing element 111.

The convex shape of the transparent element 413 is not limited to a spherical shape. Any appropriate shape can be selected depending on the required converging ratio or luminous intensity profile.

Next referring to FIGS. 5 through 15, some modifications regarding the shape of the opening 105 and the layout pattern inside the opening 105 will be explained.

Figure 5:
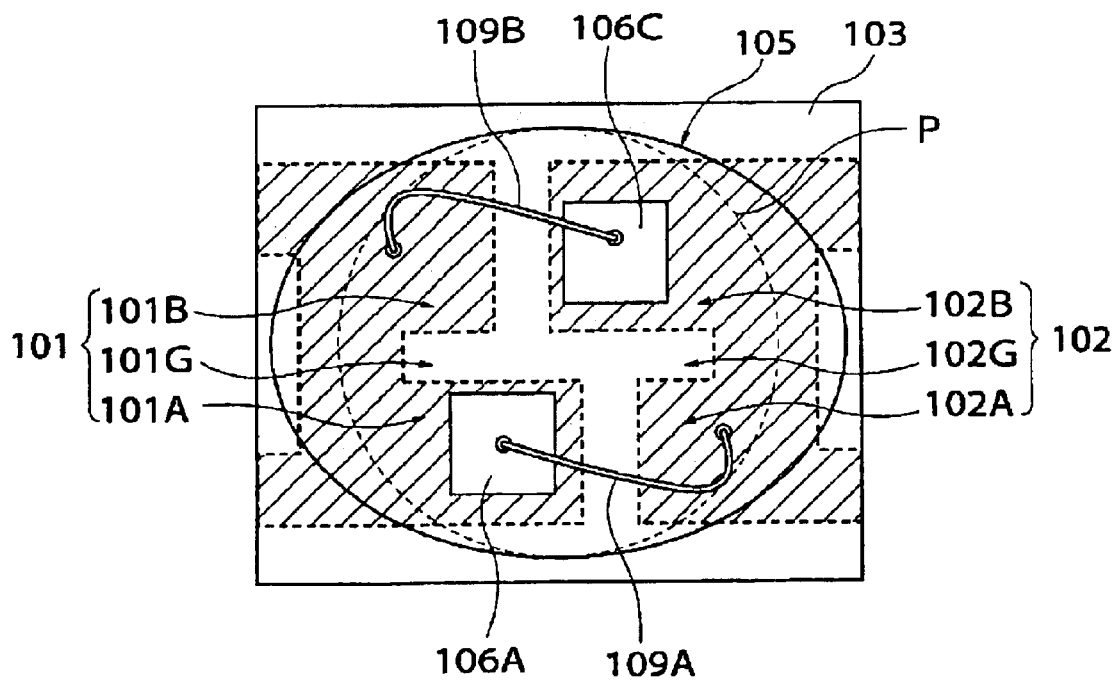
FIG. 5 is a plan view that schematically shows the fifth specific example of the light emitting device according to the first embodiment.

FIG. 5 is a plan view that schematically shows the fifth specific example regarding the sealing element 111 in the light emitting device according to the first embodiment. Here again, the same or equivalent components as those already explained with reference to FIGS. 1A through 4 are commonly labeled, and their detailed explanation is omitted for simplicity.

The light emitting device shown here includes two semiconductor light emitting elements 106, 106C on board. For connecting two elements in parallel by using the layout pattern shown here, elements 106A, 106C reversed in conduction type may be used. That is, one of them may be configured n-side down while the other p-side down.

If two light emitting elements 106A, 106C are equal in emission wavelength, the optical output of the light emitting device can be doubled.

If the light emitting elements are different in emission wavelength, the light emitting device can provide light of a mixed color. In this case, white light can be realized by combining, for example, a blue light emitting element and a yellow light emitting element that are chromatically complementary. White light can be obtained also by combining a red light emitting element and a blue-green light emitting element.

Figure 6:
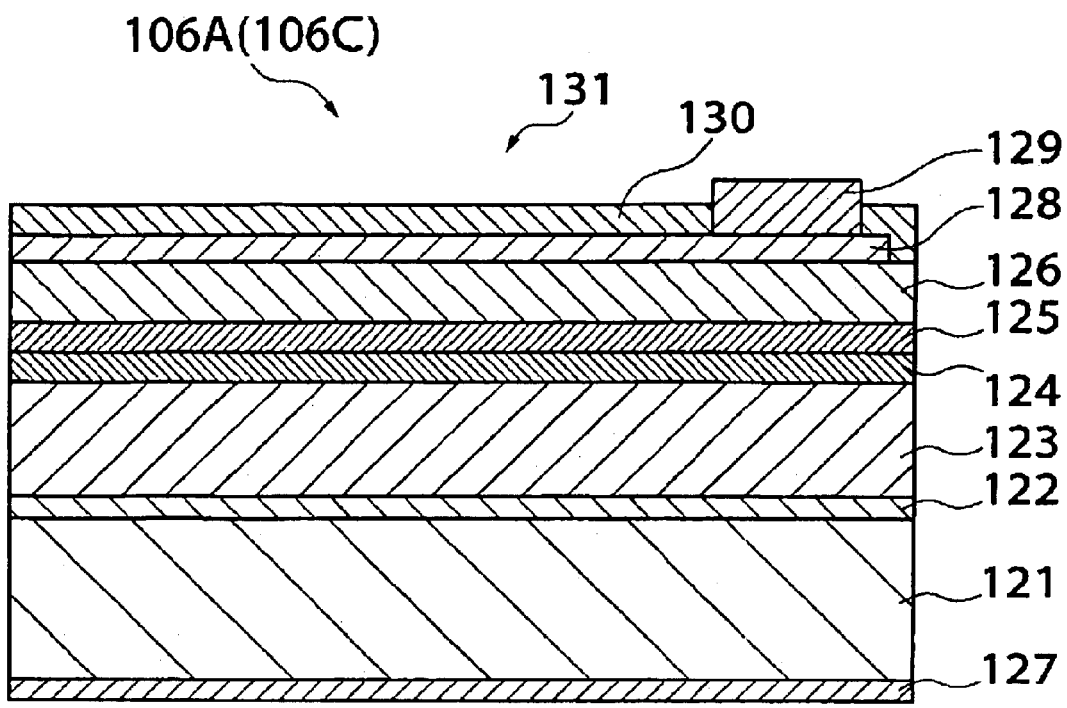
FIG. 6 is a cross-sectional view that schematically shows the structure of a semiconductor light emitting element usable in the configuration shown in FIGS. 1A and 1B or FIG. 5.

FIG. 6 is a cross-sectional view that schematically shows the structure of a semiconductor light emitting element usable in the configuration shown in FIGS. 1A and 1B or FIG. 5. This structure is briefly explained here. The light emitting element 106A (or 106C) includes a buffer layer 122, n-type contact layer 123, light emitting layer 124, p-type cladding layer 125 and p-type contact layer 126 sequentially stacked on a conductive substrate 121.

The light emitting layer 124 may have a quantum well (QW) structure in which barrier layers and well layers are stacked alternately.

The conductive substrate 121 may be made of, for example, an n-type semiconductor. Respective layers on the substrate may be made of, for example, III–V compound semiconductors, II–IV compound semiconductors, IV–VI compound semiconductors and other various materials.

An n-side electrode 127 is provided on the rear surface of the substrate 121. On the other hand, formed on the p-type contact layer 126 are a translucent p-side electrode 128 and a bonding pad 129 of gold (Au) connected to the p-side electrode 128. Surface of the element is covered by a protective film 130 of $SiO_2$.

When a voltage is applied to the n-side electrode 127 and the p-side electrode 128 of the light emitting element 106A (106C), light generated in the light emitting layer 124 is released from the surface 131. The emission wavelength can be adjusted in a wide range by adjusting the material and thickness of the light emitting layer.

The embodiment shown here can realize various emission colors by using such semiconductor light emitting elements.

Figure 7:
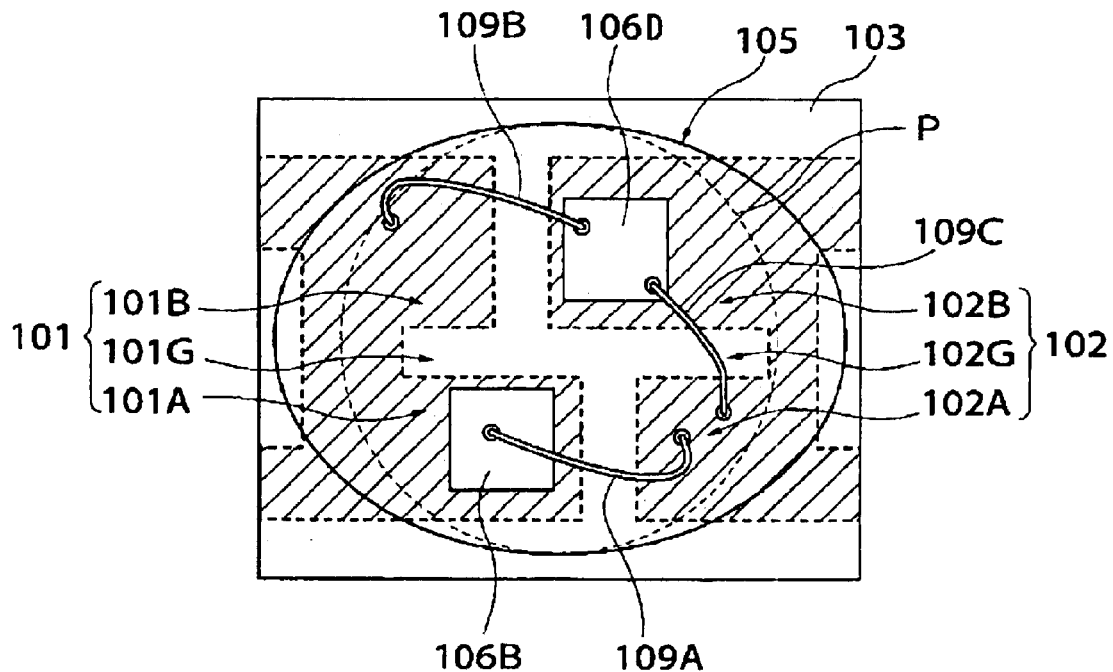
FIG. 7 is a plan view that schematically shows the sixth specific example of the light emitting device according to the first embodiment.

FIG. 7 is a plan view that schematically shows the sixth specific example according to the first embodiment. Here again, the same or equivalent components as those already explained with reference to FIGS. 1A through 5 are commonly labeled, and their detailed explanation is omitted for simplicity.

The light emitting device shown here includes a protective diode 106B and a semiconductor light emitting element 106D. The light emitting element 106D is formed on an insulating substrate, and includes p-side and n-side electrodes (not shown) on the front surface. Wires 109B, 109C extending from these electrodes are connected to the leads 101B, 102B, respectively. The protective diode 106B and the light emitting element 106D are connected in the opposite directions in parallel.

Figure 8:
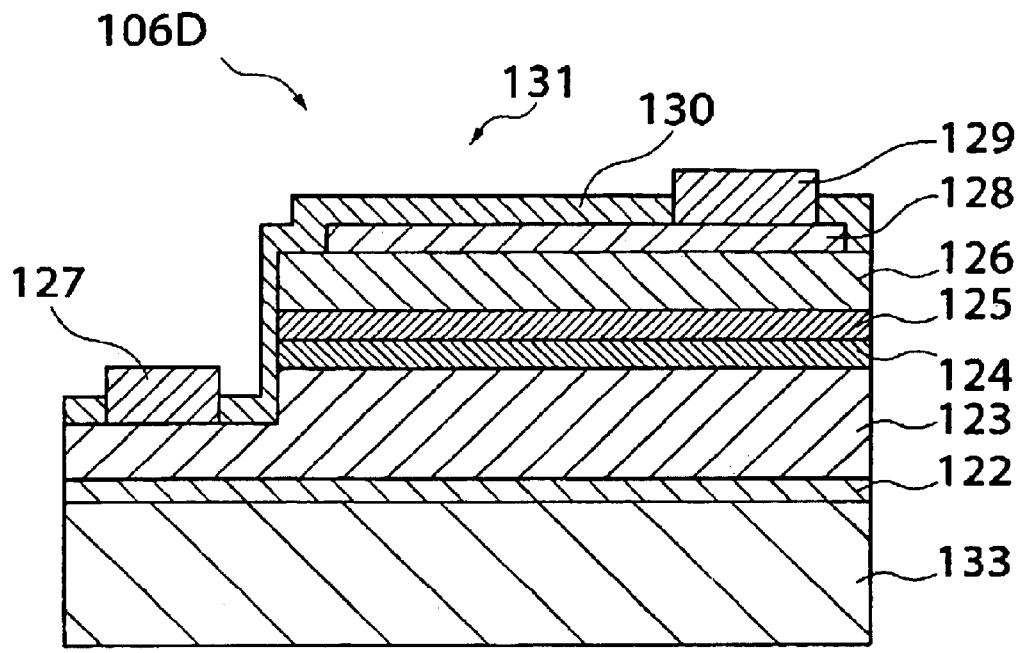
FIG. 8 is a cross-sectional view that shows a structure of the semiconductor light emitting element 106D.

FIG. 8 is a cross-sectional view that shows a structure of the semiconductor light emitting element 106D. The device shown here is made by stacking semiconductor layers on an insulating substrate 133. More specifically, sequentially stacked on the insulating substrate 133 are a buffer layer 122, n-type contact layer 123, light emitting layer 124, p-type cladding layer 125 and p-type contact layer 126. Here again, the light emitting layer 124 may have a quantum well (QW) structure in which barrier layers and well layers are stacked alternately.

On the n-type contact layer 123 exposed by selectively removing the multi-layered structure from its surface by etching, an n-side electrode 127 is formed. On the other hand, formed on the p-type contact layer 126 are a translucent p-side electrode 128 in form of a Ni/Au thin film having a thickness of tens of nanometers and a bonding pad 129 of gold (Au) connected to the p-side electrode 128. Surface of the element is covered by a protective film 130 of $SiO_2$.

When a voltage is applied to the n-side electrode 127 and the p-side electrode 128 of the light emitting element 106D, intensive emission of light is obtained in the range from ultraviolet rays to green color depending on the composition and structure of the light emitting layer 124.

The specific example shown in FIG. 7 can compactly accommodate both the semiconductor light emitting element 106D formed on the insulating substrate and the protective diode 106B in a limited space, and can reliably, easily bond the predetermined wires 109A through 109C. Moreover, since the chips and the wire bonding portion are isolated by the slits 101G, 102G, defective bonding by extrusion of the adhesive can be eliminated.

Figure 9:
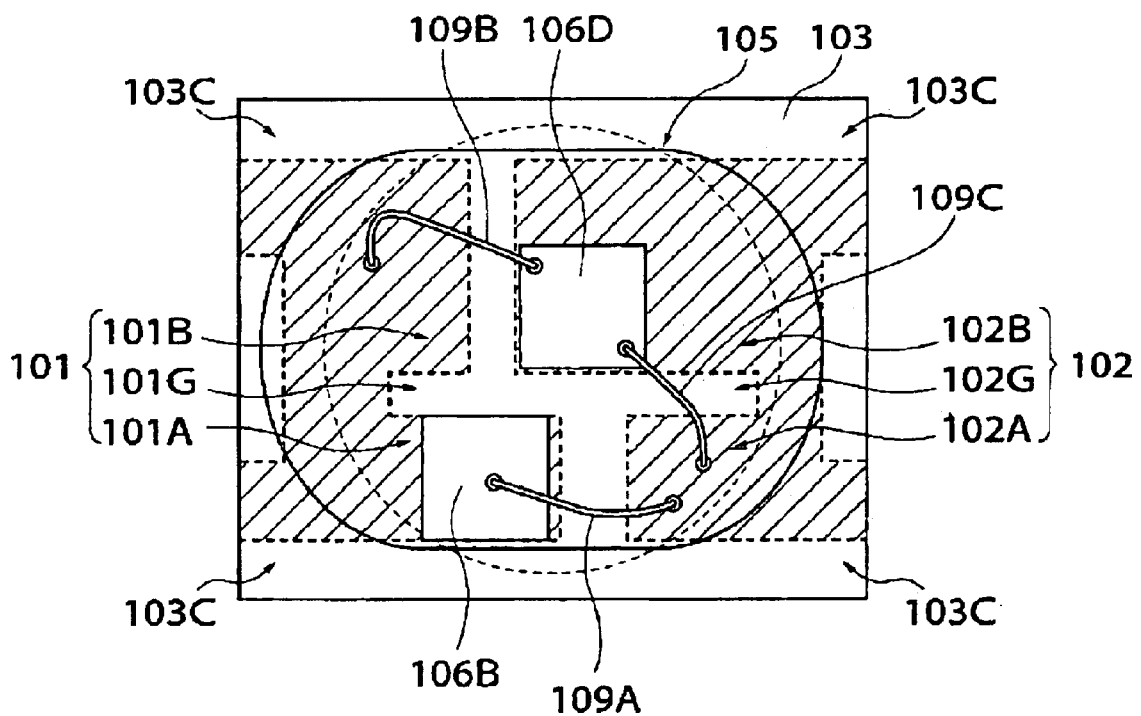
FIG. 9 is a plan view that schematically shows the seventh specific example of the light emitting device according to the first embodiment.

FIG. 9 is a plan view that schematically shows the seventh specific example according to the first embodiment. Here again, the same or equivalent components as those already explained with reference to FIGS. 1A through 7 are commonly labeled, and their detailed explanation is omitted for simplicity.

The light emitting device shown here also includes the protective diode 106B and the semiconductor light emitting element 106D. In this specific example, however, the opening 105 is not elliptical but approximately elongate-circular. In the present application, the "elongate circle" means a shape, like that of the opening 105 shown in FIG. 9, having a pair of opposed approximately arc-curved portions and connecting these curved portions by substantially straight portions. The curved portions need not be strictly arc-shaped. That is, the "approximately elongate-circle" pertains to a shape made up of a pair of curved portions connected by two substantially straight portions.

In general, the approximately elongate circle is advantageous for easier processing upon forming the opening 105 in the resin portion 103. In addition, since four corners 103C are thicker, the light emitting device can maintain a sufficient mechanical strength against a lateral stress or impulse.

Furthermore, in the specific example shown here, shapes of the distal ends of the pair of leads 101, 102 are asymmetric. That is, the portion 102B for mounting the light emitting element 106D on is formed to extend forward toward the center of the opening 105. Thus the light emitting element 106D can be located in the center of the opening 105, and the intensity profile of the emitted light, i.e. the luminous intensity property can be approximated to a uniform or symmetric profile. It is also possible to enhance the luminance. "Locating in the center" herein means to locate any portion of the light emitting element 106D on the central axis of the opening 105.

Needless to say, the specific example shown here may use the light emitting element 106A (or 106C) using a conductive substrate as shown in FIG. 6 instead of the light emitting element 106D.

Figure 10:
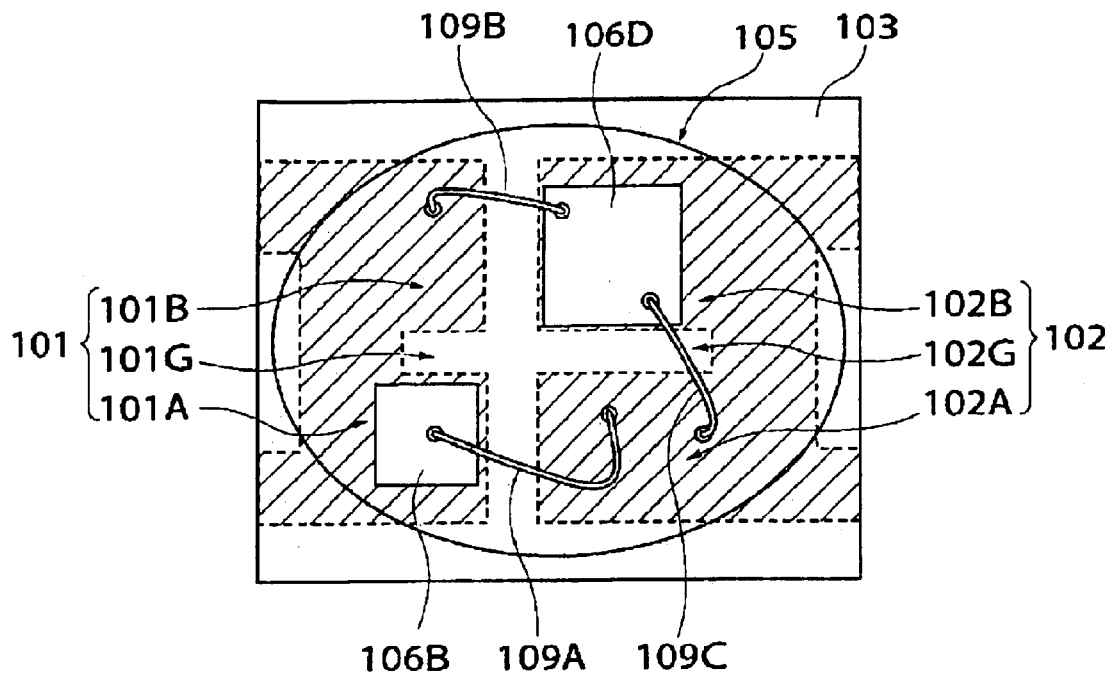
FIG. 10 is a plan view that schematically shows the eighth specific example of the light emitting device according to the first embodiment.

FIG. 10 is a plan view that schematically shows the eighth specific example according to the first embodiment. Here again, the same or equivalent components as those already explained with reference to FIGS. 1A through 9 are commonly labeled, and their detailed explanation is omitted for simplicity.

The light emitting device shown here also includes the protective diode 106B and the semiconductor light emitting element 106D. In this specific example, however, the opposed distal ends of the pair of leads 101, 102 are aligned straight instead of being offset. Then the diode 106B and the light emitting element 106D are mounted at diagonal positions.

The light emitting element 106D is formed to be closer to the center of the opening 105 than the diode 106B. Locating the optical axis closer to the center of the opening 105 ensures a more uniform luminous intensity property.

Figure 11:
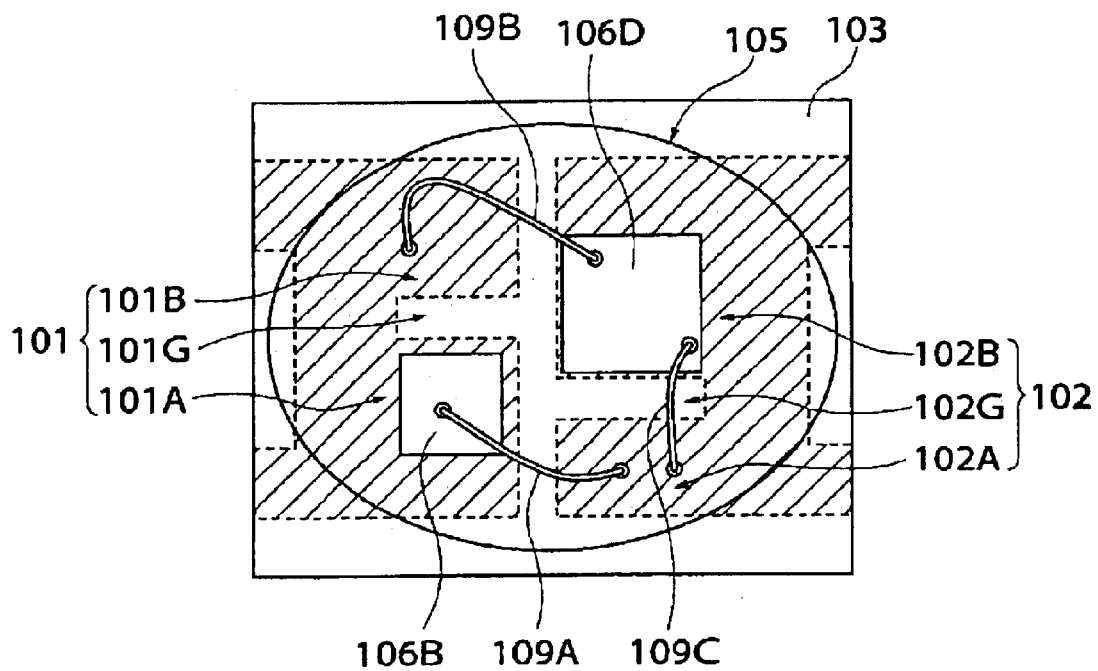
FIG. 11 is a plan view that schematically shows the ninth specific example of the light emitting device according to the first embodiment.

FIG. 11 is a plan view that schematically shows the ninth specific example according to the first embodiment. Here again, the same or equivalent components as those already explained with reference to FIGS. 1A through 10 are commonly labeled, and their detailed explanation is omitted for simplicity.

The light emitting device shown here also includes the protective diode 106B and the semiconductor light emitting element 106D, and the opposed distal ends of the pair of leads 101, 102 are aligned straight instead of being offset. In this specific example, however, the slits 101G, 102G are formed to be offset from each other. This configuration can also locate the light emitting element 106D close to the center of the opening 105.

Figure 12:
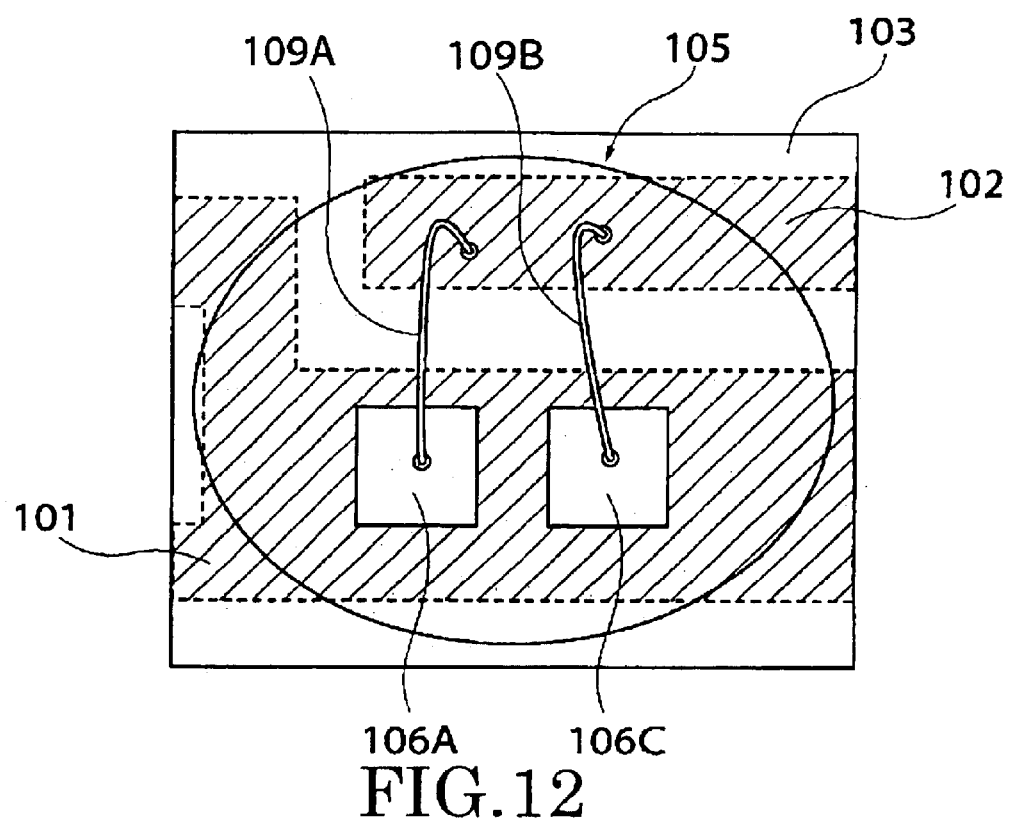
FIG. 12 is a plan view that schematically shows the tenth specific example of the light emitting device according to the first embodiment.

FIG. 12 is a plan view that schematically shows the tenth specific example according to the first embodiment. Here again, the same or equivalent components as those already explained with reference to FIGS. 1A through 11 are commonly labeled, and their detailed explanation is omitted for simplicity.

In this specific example, two chips are mounted on a common lead, and they are aligned along the lengthwise direction of the opening 105 having an approximately elliptical or elongate-circular shape.

That is, in this specific example, the semiconductor light emitting elements 106A, 106C are mounted side by side on the lead 101, and the wires 109A, 109B are connected to the lead 102 in the opposed position with respect to the shorter axis of the opening 105.

This arrangement of a plurality of chips along the longer axis, i.e. lengthwise direction, of the approximately elliptical or elongate-circular opening 105 is advantageous for effective use of the limited space.

Figure 13:
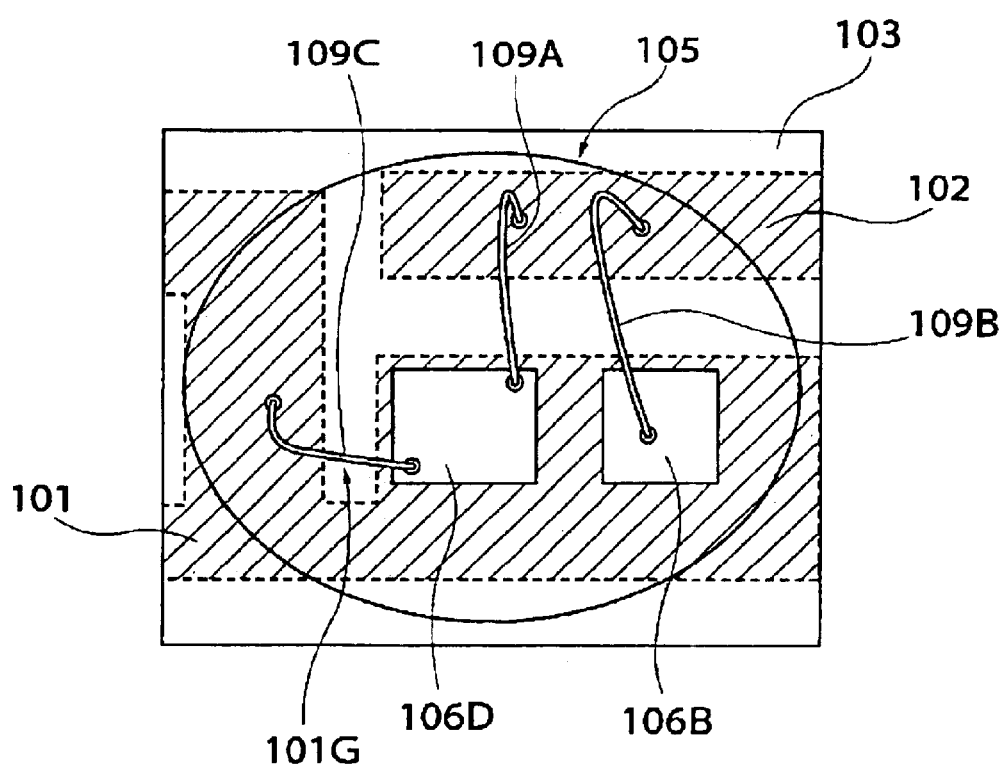
FIG. 13 is a plan view that schematically shows the eleventh specific example of the light emitting device according to the first embodiment.

FIG. 13 is a plan view that schematically shows the eleventh specific example according to the first embodiment. Here again, the same or equivalent components as those already explained with reference to FIGS. 1A through 12 are commonly labeled, and their detailed explanation is omitted for simplicity.

In this specific example, it is necessary to connect a second wire 109C from the light emitting element 106D formed on the insulating substrate to the lead 101. For this purpose, a slit 101G is formed in the lead 101, and the wire 109C is connected across the slit 101G. In this manner, the bonding region can be isolated from extrusion of the adhesive upon mounting the light emitting element 106D and the diode 106B.

Figure 14:
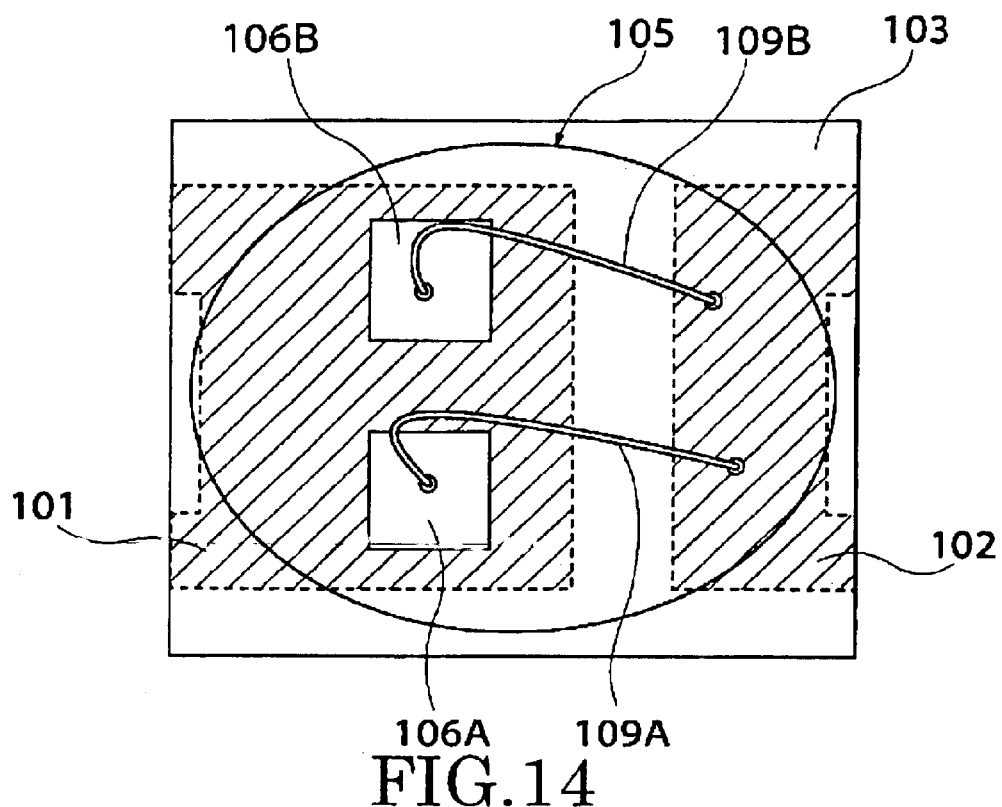
FIG. 14 is a plan view that schematically shows the twelfth specific example of in the light emitting device according to the first embodiment.

FIG. 14 is a plan view that schematically shows the twelfth specific example according to the first embodiment. Here again, the same or equivalent components as those already explained with reference to FIGS. 1A through 13 are commonly labeled, and their detailed explanation is omitted for simplicity.

Also in this specific example, two chips are mounted on a common lead. These two chips, however, are disposed along the shorter axis direction of the approximately elliptical or elongate-circular opening 15. Then the wires 109A, 109B are connected to the lead 102 in the opposed position with respect to the shorter axis of the opening 105.

This arrangement of a plurality of chips along the shorter axis of the approximately elliptical or elongate-circular opening 105 is also advantageous for effective use of the limited space.

Figure 15:
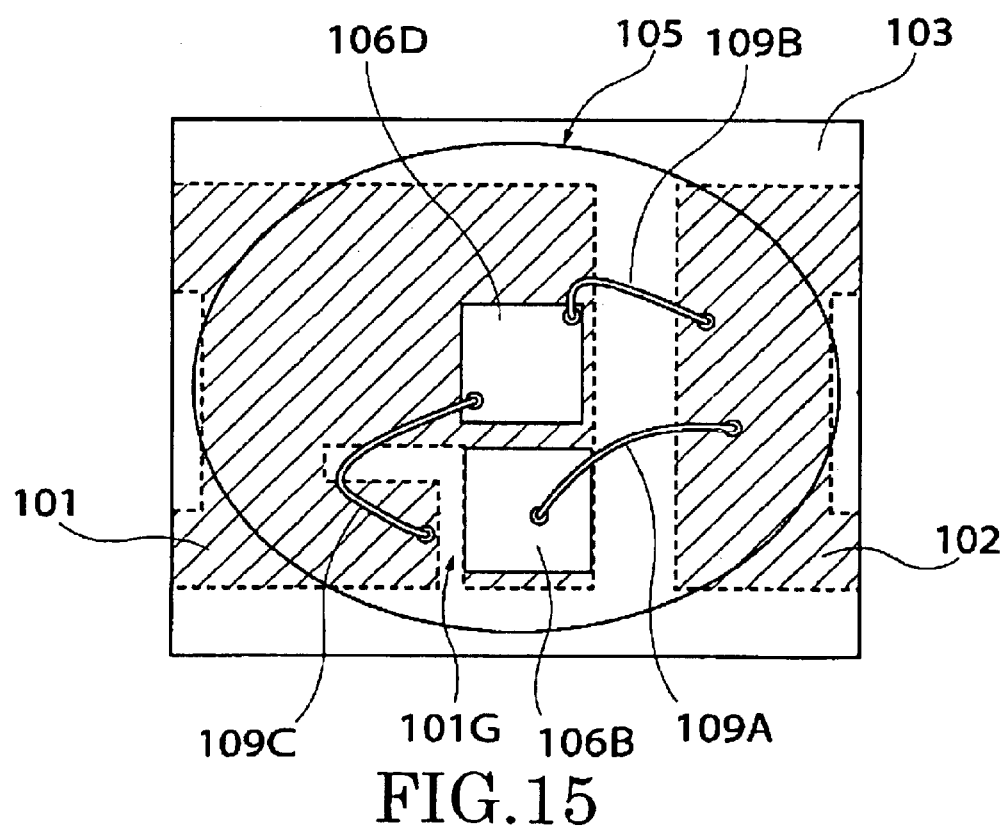
FIG. 15 is a plan view that schematically shows the thirteenth specific example of the light emitting device according to the first embodiment.

FIG. 15 is a plan view that schematically shows the thirteenth specific example according to the first embodiment. Here again, the same or equivalent components as those already explained with reference to FIGS. 1A through 14 are commonly labeled, and their detailed explanation is omitted for simplicity.

In this specific example, it is necessary to connect a second wire 109C from the light emitting element 106D to the lead 101. For this purpose, a slit 101G is formed in the lead 101, and the wire 109C is connected across the slit 101G. In this manner, the bonding region can be isolated from extrusion of the adhesive upon mounting the light emitting element 106D and the diode 106B.

Figure 16:
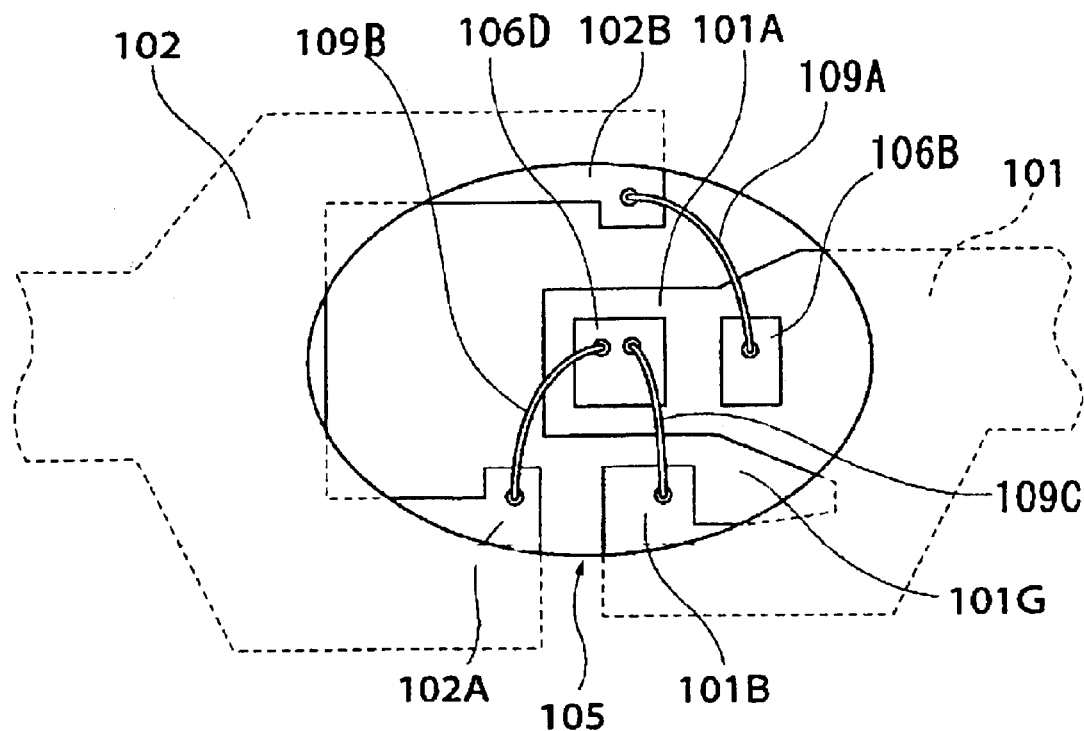
FIG. 16 is a plan view that schematically shows the fourteenth specific example of the light emitting device according to the first embodiment.

FIG. 16 is a plan view that schematically shows the fourteenth specific example according to the first embodiment. Here again, the same or equivalent components as those already explained with reference to FIGS. 1A through 15 are commonly labeled, and their detailed explanation is omitted for simplicity.

In the specific example shown here, a slit 101G is formed in the lead 101 to divide its distal end into two parts 101A, 101B. The distal end of the lead 102 is divided into parts 102A, 102B. These divisional parts extend into the opening 105.

The light emitting element 106D and the protective diode 106B are disposed on the divisional part 101A of the lead 101 along the longer axis of the opening 105.

A wire 109A extending from the diode 106B is connected to the divisional part 102B of the lead 102. A wire 109B from the light emitting element 106D is connected to the divisional part 102A of the lead 102, and the a wire 109C from the light emitting element 106D is connected to the divisional part 101B of the lead 101 across the slit 101G.

The chip layout in the specific example shown here makes it possible to locate the light emitting element 106D in the center of the opening 105. Additionally, the mode of connecting the wire 109C across the slit 101G can isolate and protect the bonding region of the wire 109C from extrusion of the adhesive upon mounting the diode 106B and the light emitting element 106D.

(Second Embodiment)

Next explained is a light emitting device including a plurality of vertically stacked chips as the second embodiment of the invention.

Figure 17:
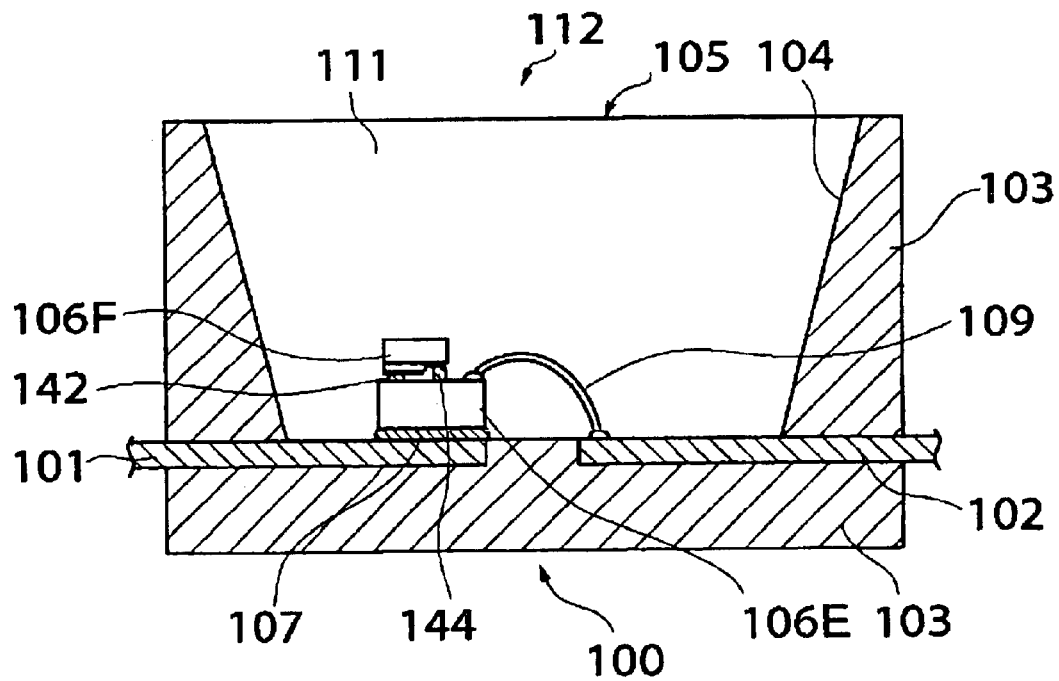
FIG. 17 is a cross-sectional view that schematically shows a configuration of the substantial part of a light emitting device according to the second embodiment of the invention.

FIG. 17 is a cross-sectional view that schematically shows a configuration of the substantial part of a light emitting device according to the second embodiment of the invention. Here again, the same or equivalent components as those already explained with reference to FIGS. 1A through 16 are commonly labeled, and their detailed explanation is omitted for simplicity.

In this embodiment, a semiconductor light emitting element 106F overlies a protective Zener diode 106E. That is, the diode 106E is mounted on the lead 101, and the light emitting element 106F is mounted thereon by flip-chip mounting. Then a wire 109 extends from the diode 106E, and it is connected to the lead 102.

The sealing element 111 is preferably made of a silicone resin having a JISA hardness in the range from 50 to 90 to ensure various advantages including reliability as already explained with reference to the first embodiment.

Figure 18A:
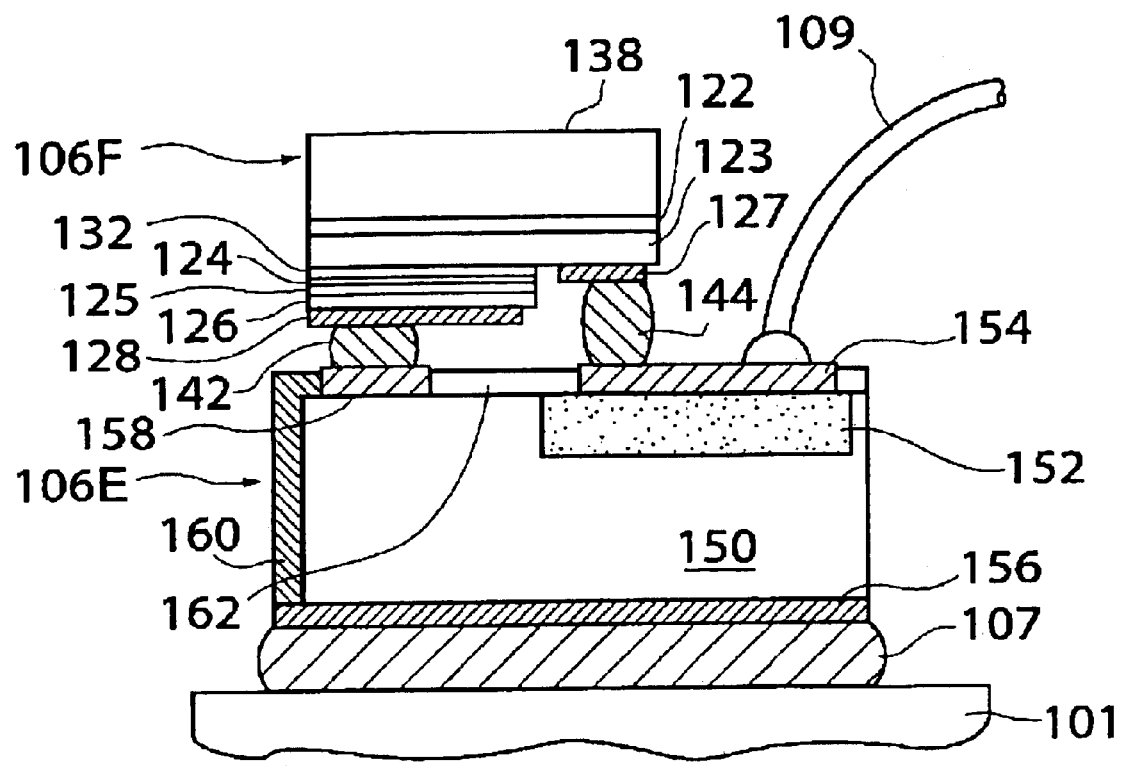
FIG. 18A is a cross-sectional view that shows a chip portion of the light emitting device according to the second embodiment in an enlarged scale.

FIG. 18A is a cross-sectional view that shows a chip portion of the light emitting device according to the second embodiment in an enlarged scale. The protective diode 106E has a planar structure in which a p-type region 152 is formed on the top surface of an n-type silicon substrate 150. The p-side electrode 154 is formed in the p-type region 152, and the n-side electrode 156 is formed on the bottom surface of the substrate 150. In addition, another n-side electrode 158 is formed on the top surface of the diode, and a wiring layer 160 connecting the upper and lower n-side electrodes 156, 158 is formed to extend on a side surface of the diode 16E.

A high-reflectance film 162 is formed on the top surface of the diode 106E. The high-reflectance film 162 has a high reflectance against light emitted from the light emitting element 106F. It may be, for example, a metal film, or a Bragg reflection film stacking two or more kinds of thin films different in refractive index.

The semiconductor light emitting element 106F includes a buffer layer 122, n-type contact layer 123, n-type cladding layer 132, active layer (light emitting layer) 124, p-type cladding layer 125 and p-type contact layer 126 sequentially stacked on a translucent substrate 138 (illustrated upside down in FIG. 18A), and also includes an n-side electrode 127 and a p-side electrode 128. Light emitted from the active layer 124 passes through the translucent substrate 138, and extracted upward as illustrated.

In the light emitting element 106F having the above-explained structure, respective electrodes are connected to the electrode of the diode 106E by bump contacts 142, 144 that may be made of, for example, gold (Au) or indium (In).

Additionally, a wire 109 is bonded to the p-side electrode 154 of the diode 106E and connected to the lead 102.

Figure 18B:
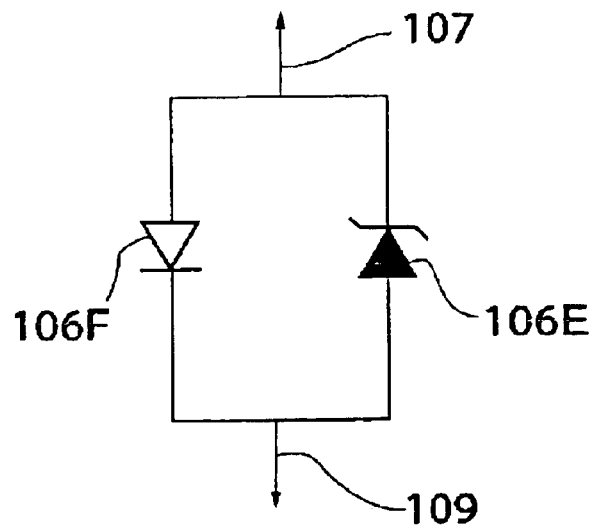
FIG. 18B is a circuit diagram of an equivalent circuit of the light emitting device according to the second embodiment.

FIG. 18B is a circuit diagram of an equivalent circuit of the light emitting device. By connecting the protective diode 106E in parallel with and in the opposite direction from the light emitting element 106F as illustrated, it is possible to protect the light emitting element 106F from a surge current or static electricity.

Figure 37A:
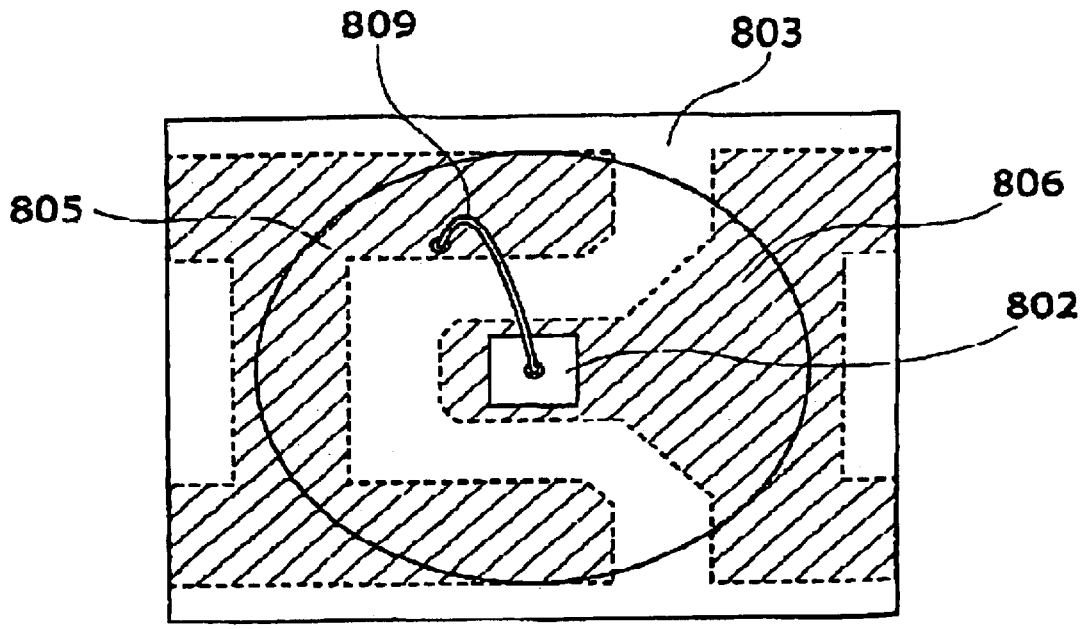
Figure 37B:
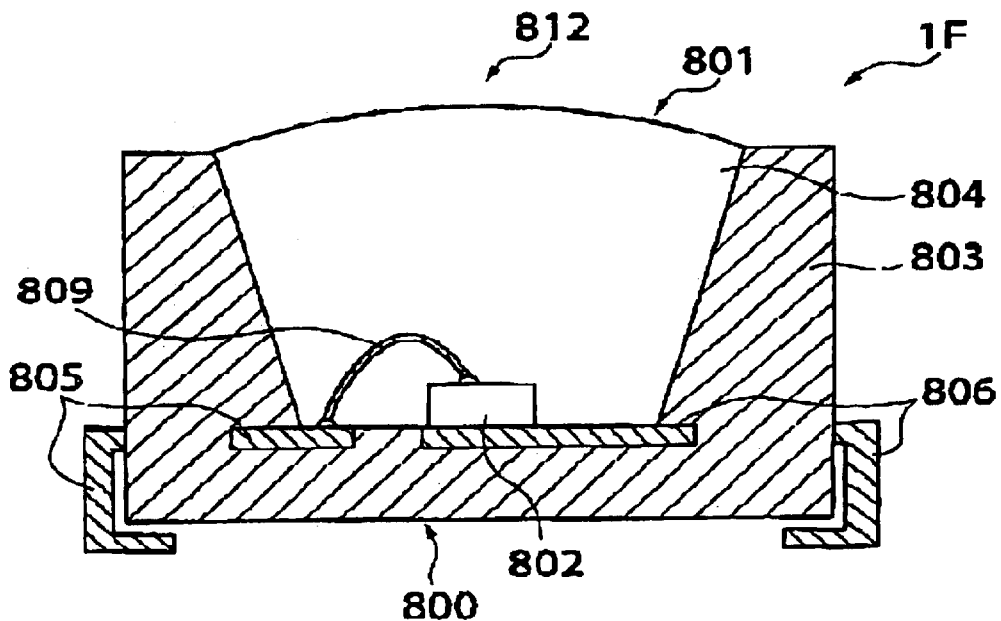

The instant embodiment vertically stacking the protective diode 106E and the light emitting element 106F can locate them in a very narrow space. Therefore, the outer dimension of the light emitting device need not be enlarged, and the conventional resin stem (package) as shown in FIGS. 37A and 37B can be use directly.

The use of the high-reflectance film 162 on the top surface of the diode 106E is effective for reflecting the light from the light emitting element 106F toward the direction for extraction and thereby improving the light extraction efficiency. Simultaneously, the high-reflectance film 162 removes the problem that the operation of the diode 106E is adversely affected or deteriorated by the light from the light emitting element 106F. Furthermore, the use of the high-reflectance film 162 prevents deterioration of the paste 107 coated under the diode 106E by light.

Furthermore, the embodiment shown here can connect the chips to the lead with only one wire. As a result, it minimizes the problems caused by deformation or breakage of wire, and thereby improves the reliability.

Moreover, the embodiment shown here can provide the bump contact 142 with a high thermal conductivity close to the light emitting layer 124 of the light emitting element 106F to provide a heat radiation path via the wire layer 160. That is, it enhances the heat radiation efficiency of the light emitting element 106F, and thereby realizes a light emitting device operative under a wider temperature range and having a long-time reliability.

In the present invention, the site of the high-reflectance film 162 is not limited to the top surface of the diode 106E, but the bottom surface of the light emitting element 106F is also acceptable. Alternatively, the high-reflectance film 162 may be inserted between the diode 106E and the light emitting element 106F.

Figure 38:
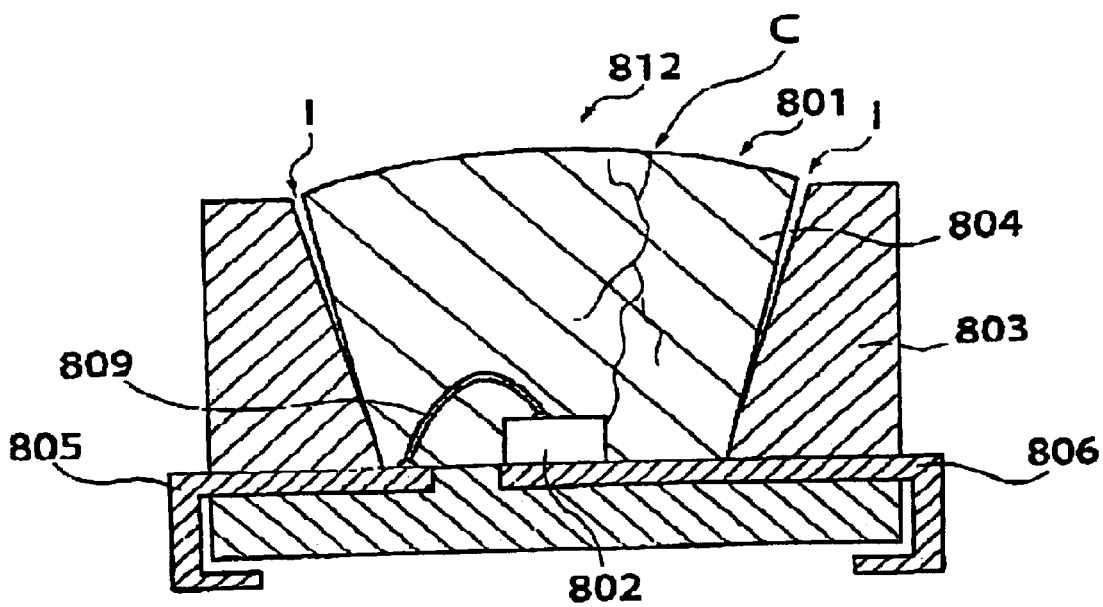
FIG. 38 is a schematic diagram that shows ho cracks C are produced in an epoxy resin 804 and how exfoliation occurs at the interface I with the resin stem 800.

The multi-layered structure of the diode 106E and the light emitting 106F in the opening 105 results in thinning the sealing element 111 so much. There rises the possibility of insufficient strength of the sealing element 11 in the upper part of the chip or a high resin stress. As a result, if a conventional epoxy resin is used, there may occur cracks in an upper part of the chip or exfoliation or splitting of the chip as shown in FIG. 38.

The invention, however, can prevent cracks of the resin and reduce the resin stress by using a silicone resin as the sealing element 111.

Explained below are some modifications of the structure using a silicone resin as the sealing element.

Figure 19:
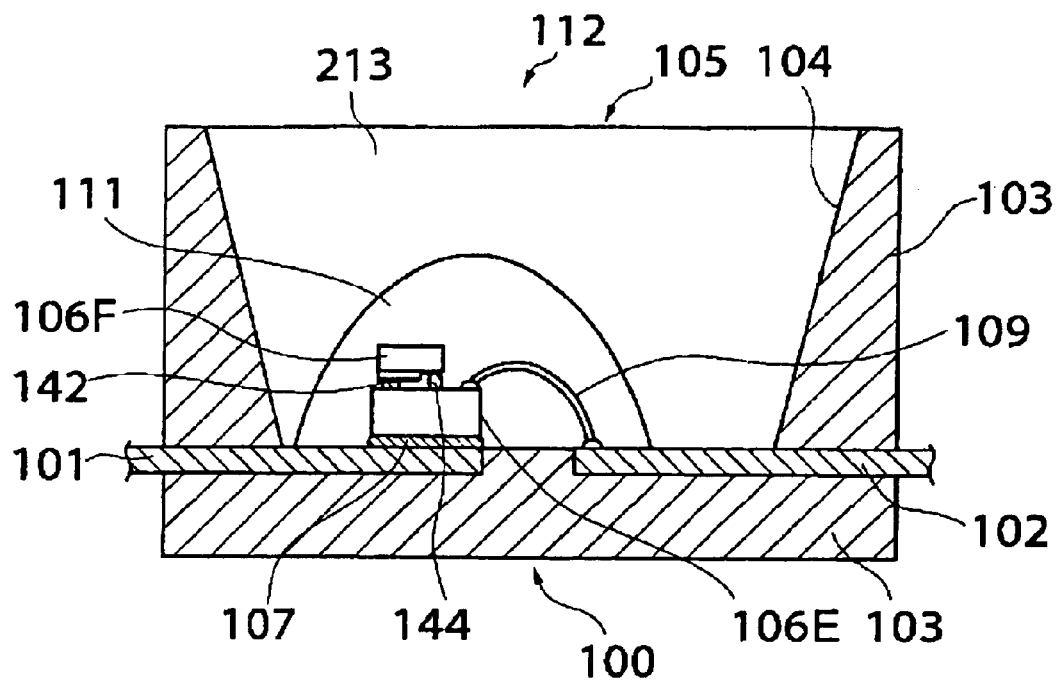
FIG. 19 is a cross-sectional view that schematically shows the second specific example regarding the sealing element 111 in the light emitting device according to the second embodiment.

FIG. 19 is a cross-sectional view that schematically shows the second specific example regarding the sealing element 111 in the light emitting device according to the second embodiment. Here again, the same or equivalent components as those already explained with reference to FIGS. 1A through 18 are commonly labeled, and their detailed explanation is omitted for simplicity.

Similarly to the device shown in FIG. 2, in the device shown here, the sealing element 111 of a silicone resin having a JISA hardness in the range from 50 to 90 merely enclose the multi-layered structure of the diode 106E and the light emitting element 106F, and a second sealing element

213 made of a translucent resin is provided outside the sealing element 111.

This configuration increases the freedom regarding the material and the additive material of the second sealing element 213 while maintaining a high reliability as already explained with reference to FIG. 2.

Figure 20:
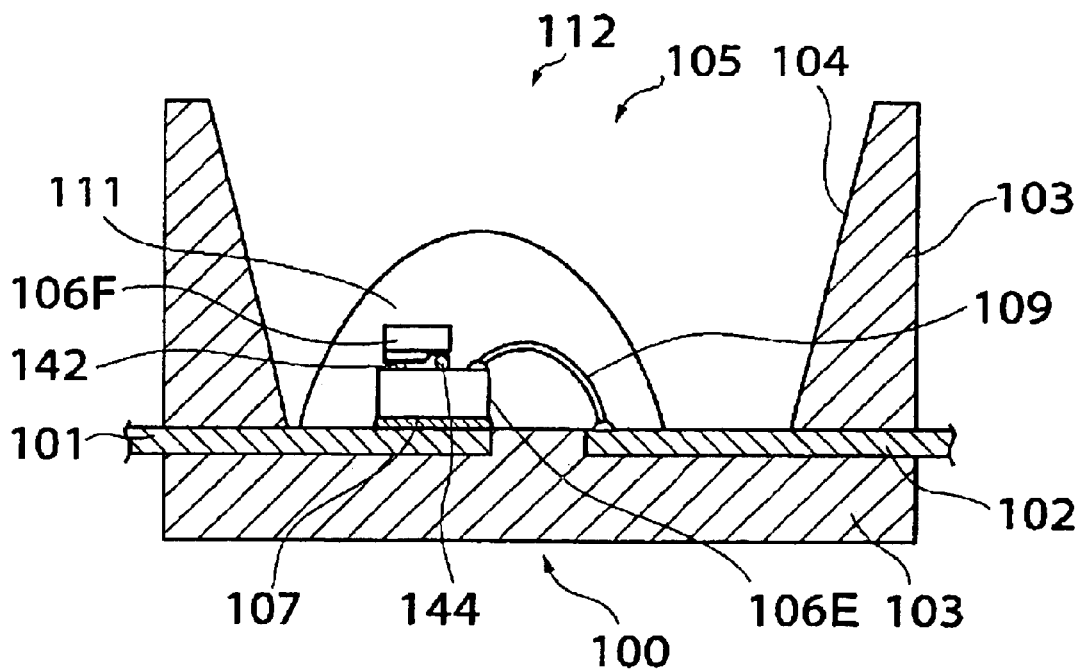
FIG. 20 is a cross-sectional view that schematically shows the third specific example regarding the sealing element 111 in the light emitting device according to the second embodiment.

FIG. 20 is a cross-sectional view that schematically shows a third specific example regarding the sealing element of the light emitting device according to the second embodiment. Here again, the same or equivalent components as those already explained with reference to FIGS. 1A through 19 are commonly labeled, and their detailed explanation is omitted for simplicity.

In this specific example, similarly to the device shown in FIG. 3, the sealing element 111 of a silicone resin having a JISA hardness in the range from 50 to 90 merely enclose the multi-layered structure of the diode 106E and the light emitting element 106F, the outside thereof is open without any other sealing element.

This configuration downsizes the emission portion as already explained with reference to FIG. 3, thereby enhances the luminance, and enhances the light converging function of the reflective surface 104 as much as the light converging function of a conventional lamp.

Figure 21:
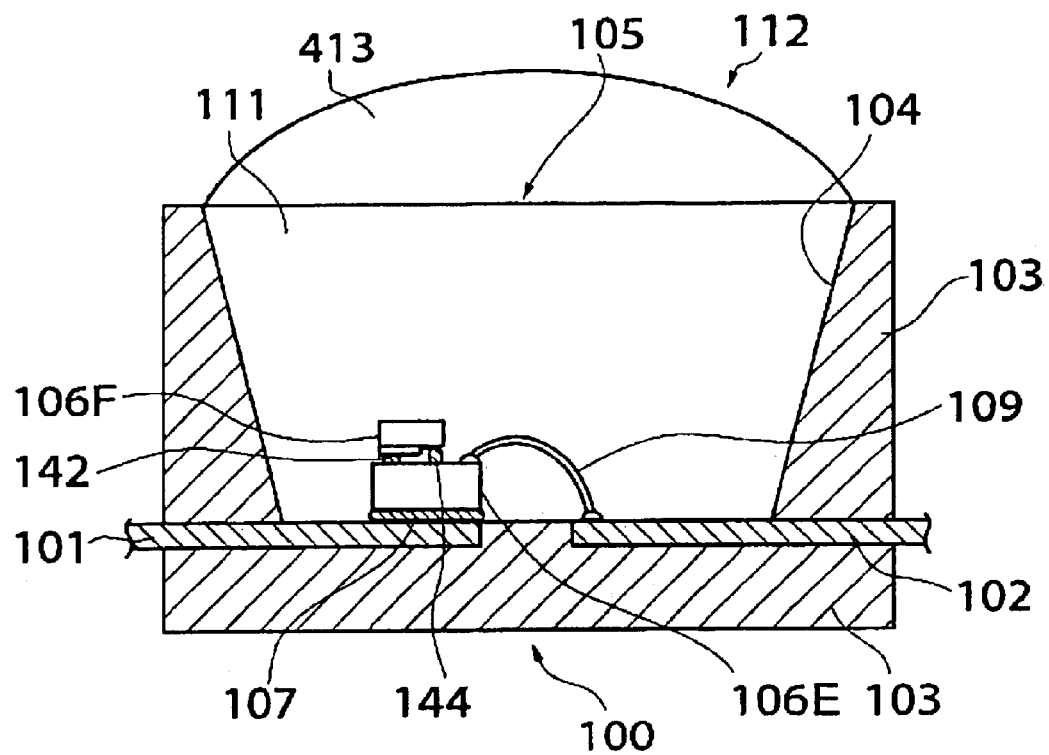
FIG. 21 is a cross-sectional view that schematically shows the fourth specific example regarding the sealing element 111 in the light emitting device according to the second embodiment.

FIG. 21 is a cross-sectional view that schematically shows a fourth specific example of the light emitting device according to the second embodiment. Here again, the same or equivalent components as those already explained with reference to FIGS. 1A through 20 are commonly labeled, and their detailed explanation is omitted for simplicity.

In this specific example, similarly to the device shown in FIG. 4, a convex translucent element 413 is provided on the sealing element 111 of a silicone resin having the JISA hardness in the range from 50 to 90. The convex translucent element 413 functions to converge light. The translucent element 413 may be made of, for example, a resin. A silicone resin is especially advantageous for reducing the difference in refractive index from the sealing element 11 and to reduce the loss by reflection at the interface with the sealing element 111.

The convex shape of the translucent element 413 is not limited to a hemisphere. Any other appropriate shape may be selected depending on the converging ratio or luminous intensity profile requested.

Since the second embodiment can locate the light emitting element 106F in the center of the opening 105, the optical converging function of the convex translucent element 413 is maximized.

(Third Embodiment)

Next explained is a light emitting device as the third embodiment that is based on the light emitting device according to the first or second embodiment but mixes a fluorescent element in the sealing element 111 such that the light from the light emitting element can be extracted after wavelength conversion by the fluorescent element.

Figure 22:
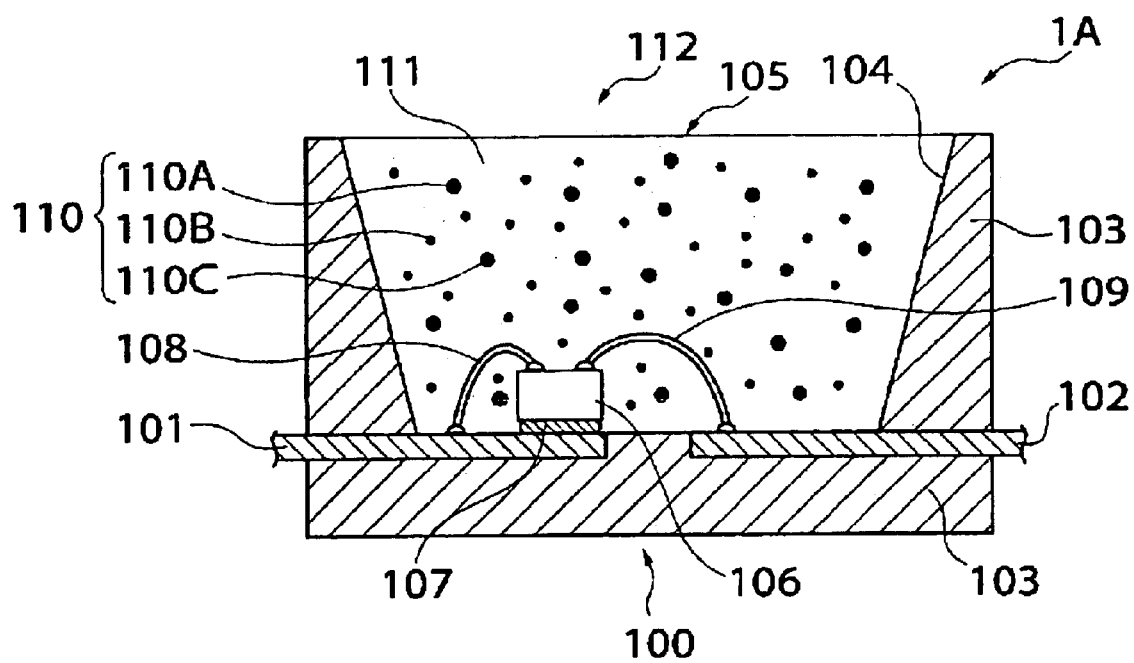
FIG. 22 is a cross-sectional view that schematically shows a configuration of the substantial part of a light emitting device according to the third embodiment of the invention.

FIG. 22 is a cross-sectional view that schematically shows a configuration of the substantial part of the light emitting device according to the third embodiment of the invention. Here again, the same or equivalent components as those already explained with reference to FIGS. 1A through 21 are commonly labeled, and their detailed explanation is omitted for simplicity.

The light emitting device shown here has a general configuration similar to that shown in FIGS. 1A and 1B. In this embodiment, however, the sealing element 111 filled in the opening 105 contains the fluorescent element 110 that absorbs primary light emitted from the light emitting element 106 and releases secondary light after wavelength conversion. Material of the fluorescent element 110 may be determined adequately taking account of the wavelength of the primary light emitted from the light emitting element 106, wavelength of the secondary light requested, and so on.

In the light emitting device, the fluorescent element 110 may be designed either to convert the wavelength of a part of the primary light from the light emitting element 106 into secondary light so as to permit mixed light of the non-converted primary light and the secondary light to be extracted, or to absorb all of the primary light from the light emitting element 106 such that the secondary light alone is extracted substantially.

In case of the former scheme, if the light emitting element 106 emits blue light, and fluorescent element converts the wavelength of a part of the blue light into yellow light, and white light as a result of mixture of the blue light and yellow light is extracted. There are, however, various other combinations of the primary light and the secondary light. To obtain white light, the primary light and the secondary light may be complementary.

The latter scheme that permits only the secondary light to be extracted is advantageous for eliminating influences of the balance of the primary light and the secondary light. That is, this method can remove the problem of change of color by deviation or fluctuation of the emission characteristics of the light emitting element 106 and the fluorescent element 110. For example, even when the wavelength of the light emitting element 106 fluctuates among products or shifts due to various factors such as temperature conditions and changes with time, influences thereof to each fluorescent element are small, and the balance of the mixed color obtained from the fluorescent elements does not change substantially. It results in realizing a light emitting device having remarkably stable lΨemission characteristics over a wide temperature range and a long operation time.

In any of these schemes, the fluorescent element 110 may be either a singular material or a combination of a fluorescent element 110A for releasing red light, fluorescent element 110B for releasing green light and fluorescent element 110C for releasing blue light. In this case, white color is obtained. There are, however, various other combinations as explained later.

Fluorescent elements 110 and sealing elements 111 usable in the third embodiment will be explained below in greater detail.

(Re: Fluorescent Element 110)

The fluorescent element 110 used in the embodiment of the invention is a fluorescent material that releases light by absorbing ultraviolet light shorter than 400 nm emitted from the light emitting layer 124 of the light emitting element 106, or a material that releases light by absorbing light emitted from another fluorescent element. The fluorescent element 110 preferably has a conversion efficiency of 1 lumen/watt or more.

White light can be realized by mixing three primary colors of red, green and blue, or by mixing any two complementary colors. White light by three primary colors can be realized by using a first fluorescent element for releasing blue light by absorbing the primary light from the light emitting element 106, a second fluorescent element for releasing red light, and a third fluorescent element for releasing green light.

Alternatively, white light can be realized by using a light emitting element 106 which emits blue light, a first fluorescent element which releases red light by absorbing the primary light from the light emitting element, and a second fluorescent element which releases green light by absorbing the primary light from the light emitting element, and by mixing these primary light and secondary lights.

White light by complementary colors can be realized by combining a first fluorescent element for releasing blue light by absorbing light from the light emitting element 106 and a second fluorescent element for emitting yellow light by absorbing the blue light, or by combining a first fluorescent element for releasing green light by absorbing light from the light emitting element 106 and a second fluorescent element for releasing red light by absorbing the green light.

Fluorescent elements whose wavelength changes are not larger than 50 nm in the temperature range from −40° C. to 100° C. are preferably used to realize a light emitting device independent from temperature characteristics of the light emitting element.

The use of fluorescent elements whose wavelength changes do not exceed 50 nm when the light emitting element 106 is operated by a drive current in the range from 1 mA to 100 mA enables realization of a light emitting device independent from changes in emission spectrum caused by the drive current of the element.

There are the following fluorescent materials that can release blue light.

ZnS:Ag
ZnS:Ag+Pigment
ZnS:Ag,Al
ZnS:Ag,Cu,Ga,Cl
ZnS:Ag+$In_2O_3$
ZnS:Zn+$In_2O_3$
(Ba,Eu)$MgAl_{10}O_{17}$
$(Sr,Ca,Ba,Mg)_{10}(PO_4)_6Cl_2$:Eu
$Sr_{10}(PO_4)_6Cl_2$:Eu
(Ba,Sr,Eu)(Mg,Mn)$Al_{10}O_{17}$
10(Sr,Ca,Ba,Eu)·$6PO_4·Cl_2$
$BaMg_2Al_{16}O_{25}$:Eu There are the following fluorescent elements that can release green light.

ZnS:Cu,Al
ZnS:Cu,Al+Pigment
(Zn,Cd)S:Cu,Al
ZnS:Cu,Au,Al,+pigment
$Y_3Al_5O_{12}$:Tb
$Y_3(Al,Ga)_5O_{12}$:Tb
$Y_2SiO_5$:Tb
$Zn_2SiO_4$:Mn
(Zn,Cd)S:Cu
ZnS:Cu
$Zn_2Si_4$:Mn
ZnS:Cu+$Zn_2SiO_4$:Mn
$Gd_2O_2S$:Tb
(Zn,Cd)S:Ag
ZnS:Cu,Al
$Y_2O_2S$:Tb
ZnS:Cu,Al+$In_2O_3$
(Zn,Cd)S:Ag+$In_2O_3$
$(Zn,Mn)_2SiO_4$
$BaAl_{12}O_{19}$:Mn
(Ba,Sr,Mg)O·$aAl_2O_3$:Mn
$LaPO_4$:Ce,Tb
$Zn_2SiO_4$:Mn
ZnS:Cu
3(Ba,Mg,Eu,Mn)O·$8Al_2O_3$
$La_2O_3$·$0.2SiO_2$·$0.9P_2O_5$:Ce,Tb
$CeMgAl_{11}O_{19}$:Tb There are the following fluorescent materials usable to release red light.

$Y_2O_2S$:Eu
$Y_2O_2S$:EU+pigment
$Y_2O_3$:Eu
$Zn_3(PO_4)_2$:Mn
(Zn,Cd)S:Ag+$In_2O_3$
(Y,Gd,EU)$BO_3$
$(Y,Gd,Eu)_2O_3$
$YVO_4$:Eu
$La_2O_2S$:Eu,Sm The following fluorescent material, for example, can be used for releasing yellow light.

YAG:Ce

By using those red fluorescent elements, green fluorescent elements and blue fluorescent elements in an appropriate adjusted R:G:B ratio, any desired tone can be made. For example, white colors from white lamp color to white fluorescent lamp color can be realized by one of 1:1:1 through 7:1:1, 1:1:1 through 1:3:1 and 1:1:1 through 1:1:3 in R:G:B weight % ratio.

When the total weight percent of the mixed fluorescent elements is adjusted in the range from 1 weight % to 50 weight % relative to the weight of the sealing element containing the fluorescent elements, substantial wavelength conversion is realized. When it is adjusted in the range of 10 weigh % to 30 weight %, a light emitting device with a high luminance is realized.

In case those RGB fluorescent elements are appropriately selected and mixed, the tone of the sealing element 111 will become white. That is, since the light emitting device emitting white light looks white also in the OFF state, its appearance is good, and a light emitting device excellent from the visual and design viewpoints can be provided.

Fluorescent materials usable in the invention are not limited to inorganic fluorescent materials. High-luminance light emitting devices can be realized also by similarly using the following organic dye materials.

xanthene dyes
oxazine dyes
cyanine dyes
rhodamine B (630 nm)
coumarin 153 (535 nm)
polyparaphenylene vinylene (510 nm)
coumarin 1 (430 nm)
coumarin 120 (450 nm)
tris-(8-hydroxyquinoline) aluminum (Alq3 or AlQ) (green light)
4-dicyanomethylene-2-methyl-6(p-dimethylaminostyrene)-4H-pyran (DCM) (orange/red light)

Also when some kinds of dye materials are used, individual dye materials can be dispersed in the resin by adding respective dye materials into a silicone resin as the sealing element and stirring it, and excitation efficiency of dyes can be enhanced.

According to the embodiment of the invention, various colors of light can be realized with the light emitting device by combining appropriate materials of the fluorescent element (including dyes) 110 contained in the sealing element 111. That is, any desired tone can be realized by combining red, green, blue and yellow fluorescent materials (and dyes).

On the other hand, the embodiment of the invention can also realize stabilization of the emission wavelength, which could not attained with conventional semiconductor light emitting elements, even by using a single fluorescent element. That is, ordinary semiconductor light emitting elements are subject to shifting of the emission wavelength depending on the drive current, ambient temperature and modulating conditions. In contrast, in the light emitting device according to the embodiment of the invention, the emission wavelength is remarkably stable, independently of changes of the drive current and temperature by substantially extracting only the secondary lights emitted from the fluorescent elements.

In addition, the emission characteristics of the light emitting device according to the embodiment of the invention is determined by the characteristics of the additive fluorescent element 110 regardless of characteristics of the light emitting element 106, the production yield can be increased without variances of characteristics among different light emitting devices.

(Re: Surface Configuration of the Sealing Element 111)

The Inventors have got new knowledge about the surface configuration of the sealing element 111 through his own trial and review about it.

Figures 23A, 23B, 23C:
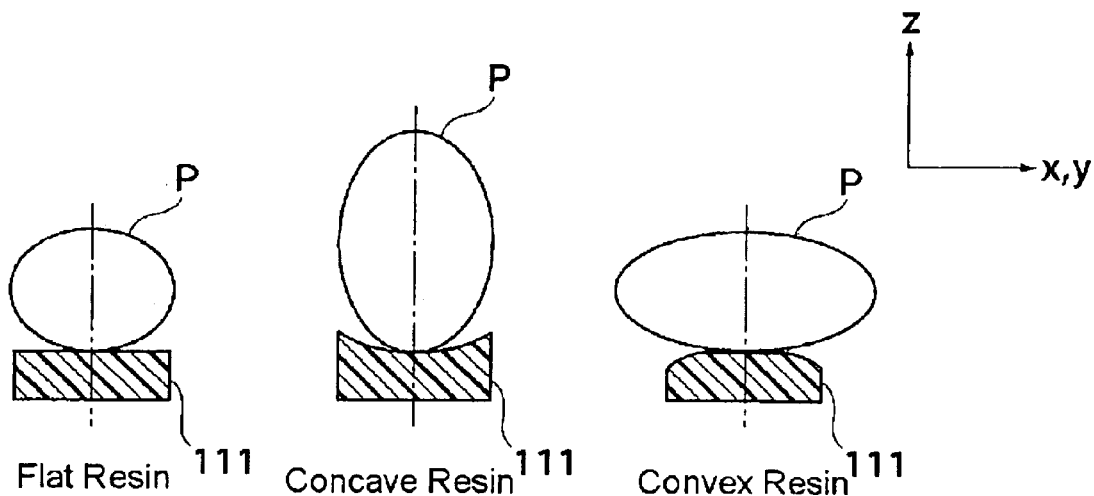

FIGS. 23A through 23C show schematic diagrams that illustrate intensity profiles of emitted light depending upon the surface configuration of the sealing element. The profile of FIG. 23A is the intensity profile P of light from the light emitting element 106 using a sealing element 111 having a flat surface configuration, the profile of FIG. 23B is that with a sealing element 111 having a concave surface configuration, and the profile of FIG. 23C is that with a sealing element 111 having a convex surface configuration.

In comparison with the case of the flat configuration shown in FIG. 23A, the intensity profile, i.e. orientation characteristics, of the emitted light of the device having the concave surface configuration shown in FIG. 23B apparently converges in the direction of the vertical axis Z. In contrast, the profile corresponding to the convex surface configuration shown in FIG. 23C diverges in the direction of the xy plane. Its reason might be that the light emitted from the fluorescent element contained near the convex portion of the sealing element 111 having the convex surface configuration spreads in the xy plane direction whereas the light emitted from the fluorescent element contained near the surface of the sealing element having the concave surface configuration is reflected by the side wall reflective surface 104 and contributes to increase the ratio of light traveling in the z-axis direction.

The surface configuration of the sealing element 111, either convex or concave, can be determined by adjusting its quantity to be buried. That is, by adjusting the filling quantity of the sealing element 111, any desired orientation characteristics of the emitted light can be obtained.

In case a plurality of light emitting devices are arranged in parallel as a planar type image display apparatus, the convex surface configuration of the sealing element 111 may generate undesirable excited light in receipt of the light from adjacent light emitting devices. Therefore, the sealing element 111 preferably has a concave surface configuration also in applications of this kind.

The embodiment of the invention can reliably, readily cope with those requirements by adjustment of the filling quantity of the sealing element 111.

(Re: Material of the Sealing Element 111)

The sealing element 111 is a member containing the fluorescent element 110 buried in the opening 105 to convert primary light from the light emitting element 106. For this purpose, the sealing element 111 is preferably made of a material having a larger coupling energy than the energy of the primary light from the light emitting element 106. Additionally, it preferably has the property of transmitting light after wavelength conversion by the fluorescent element 110.

If, however, conventional epoxy resins are used as the material of the sealing element 111, the optical resistance to the primary light emitted from the light emitting element 106 may not be sufficiently high. More specifically, in receipt of primary light from the light emitting element 106, epoxy resins, originally transparent, change in color through yellow, liver to black, and it results in a serious decrease of the light extraction efficiency. This problem becomes more serious as the wavelength of the primary light becomes shorter.

Through trials and reviews, the Inventors have found that the use of silicone resin leads to a very satisfactory result. That is, if a silicone resin is used, change or color and other types of deterioration do not occur even after it is exposed to light having a comparatively shorter peak wavelength. By actually using silicone resin in a light emitting device using short-wavelength light as primary light, a high reliability could be realized.

The Inventors have found that some silicone resins have a fairly high transmittance in the wavelength range from ultra violet through the visible range. In addition, the optical transmittance thereof can be kept more than 60% of the initial value even after operation of 1000 hours.

In a manufacturing process of the device shown in FIG. 22, silicone resin containing the fluorescent element 110 is coated onto the light emitting element 106 mounted in the opening 105 by supplying it through a narrow nozzle while agitating it to uniformly mix predetermined fluorescent materials, and it is thereafter hardened.

In this process, it is preferable to use a silicone resin having a pre-curing viscosity around 100 cp through 10000 cp because it can hold particles of the fluorescent element uniformly dispersed without segregation or segmentation. In this manner, light from the excited fluorescent element is uniformly, adequately spread by a fluorescent element having a large refractive index without being excessively spread or absorbed by other fluorescent elements. Therefore, light is uniformly mixed, and tone irregularity can be prevented.

The silicone resin used in the embodiment of the invention has a high bonding force to the resin portion 103 and a high strength to humidity, and it is unlikely to crack even under a temperature stress. Additionally, the silicone resin buried in the opening can greatly alleviate the resin stress to the light emitting element 106 and the Au wire even upon changes of the ambient temperature.

The Inventors further developed researches from those viewpoints. As a result, it has been found that the use of "rubber-like" silicone resin having a high hardness leads to an excellent result. Hardness of ordinary silicone resins ranges from 30 to 40 in JISA hardness value that is the hardness of the JIS standard. These silicone resins exhibit gel-like physical properties, and are physically soft. Those silicone resins are hereinbelow called "gel-like silicone resins".

In contrast, "rubber-like silicone resins" have a JISA hardness in the range of approximately 50 to 90. Epoxy resins widely used as the sealing element materials in conventional light emitting devices have a JISA hardness around 95.

The Inventors compared and reviewed both "rubber-like silicone resins" and "gel-like silicone resins", and has got the following knowledge.

When gel-like silicone was used, the fluorescent element 110 spread in the resin during the supply of a current, and there was observed changes of tone. In case of a RGB tri-color mixture type, because of a large specific gravity of the red (R) fluorescent element, this fluorescent element migrated vertically downward, and an increase of the x value of the chromaticity coordinates was observed.

Figure 24:
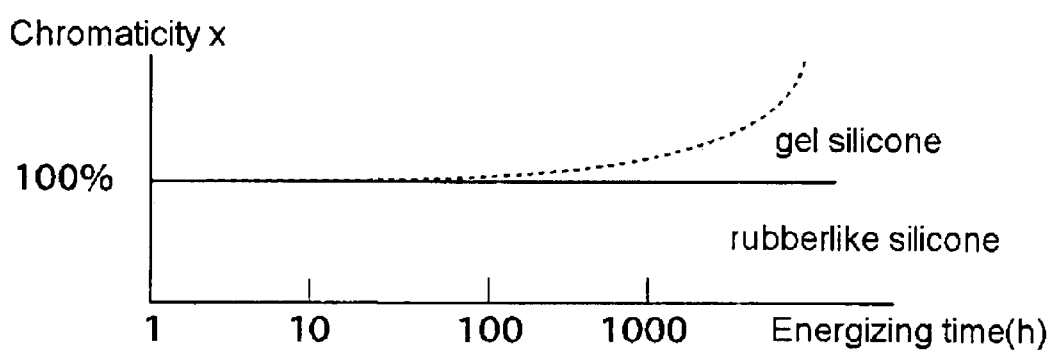
FIG. 24 is a graph that shows measured changes of chromaticity x with current-supply time.

FIG. 24 is a graph that shows measured changes of chromaticity x with current-supply time. As shown there, in case a gel-like silicone resin is used as the material of the sealing element 111, the chromaticity x begins to increase from near 100 hours of the current supply time, and exhibits an accelerative increase beyond 1000 hours. In contrast, in case a rubber-like silicone resin is used, no tone change was observed even after operation of 10000 hours under raised temperatures of the light emitting device due to the electric supply. It is presumed that the rubber-like silicone resin, hard and closely packed, was less likely to permit diffusion of the fluorescent element.

Thus, a degradation of the optical performance can be prevented by using the rubber-like slilicone instead of the gel-like silicone.

On the other hand, when a scattering agent is added together with the fluorescent element 110 to the silicone resin as the sealing element, it is possible to scatter and evenly deliver primary light from the light emitting element 106 to the fluorescent particles and to scatter the light from the fluorescent element 110 so as to realize a uniform mixture of colors. This contributes to realization of desired emission characteristics even with a less quantity of fluorescent element 110.

As explained above, according to the invention, by mixing the fluorescent element 110 into the sealing element 111 of a silicone resin having a specific hardness, emission characteristics and reliability can be improved significantly.

The instant embodiment, when applied to the light emitting element according to the first and third embodiments of the invention, ensures the following effects.

Hereinbelow, these specific examples are explained with reference to the drawings.

Figure 25:
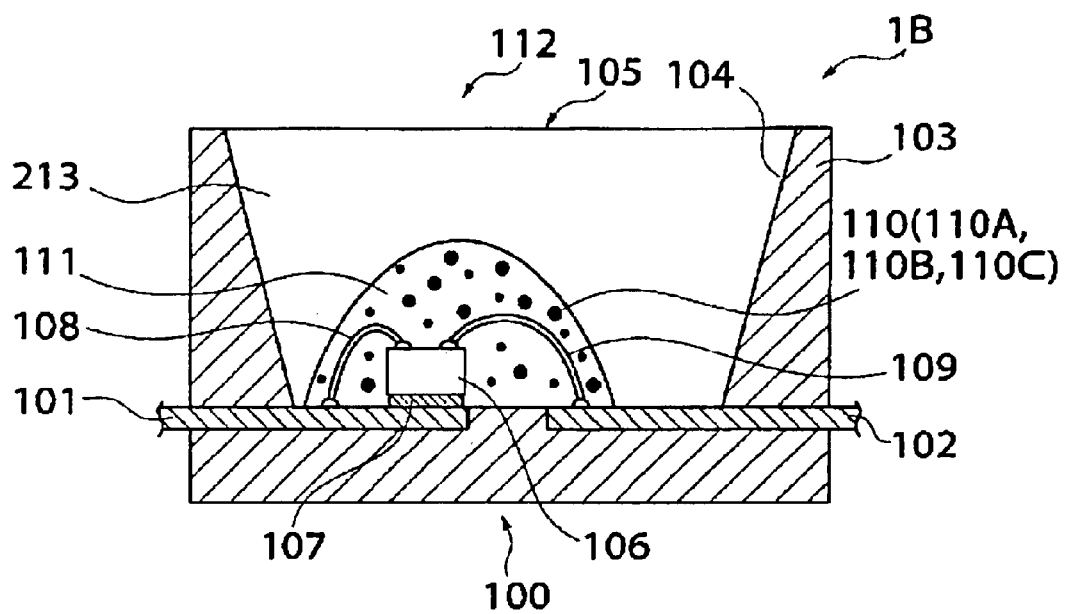
FIG. 25 is a diagram corresponding to FIG. 2, in which, however, the sealing element 111 contains a fluorescent element 110.
Figure 26:
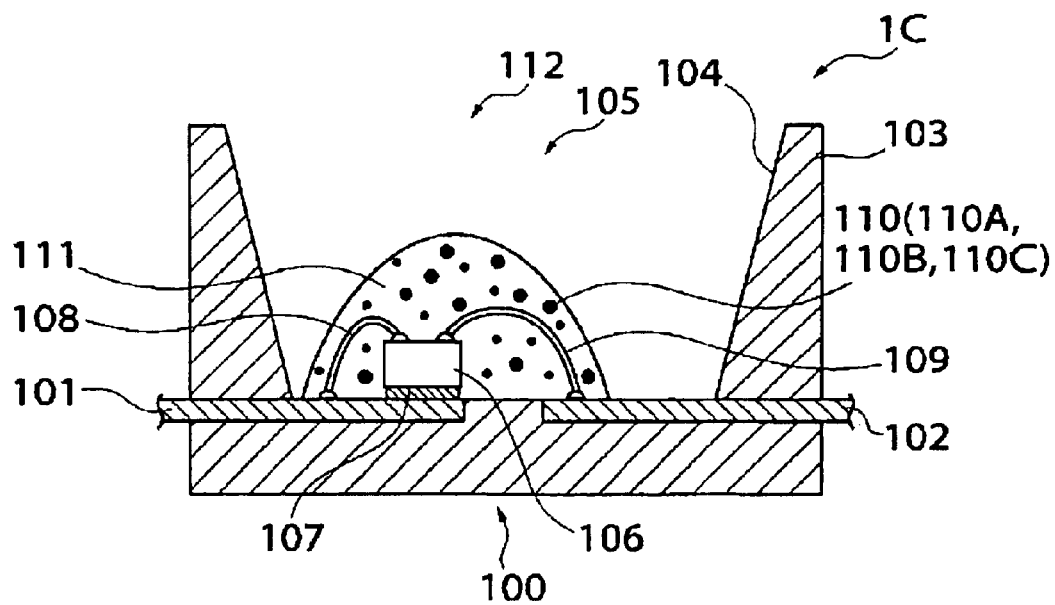
FIG. 26 is a diagram corresponding to FIG. 3, in which, however, the sealing element 111 contains a fluorescent element 110.
Figure 27:
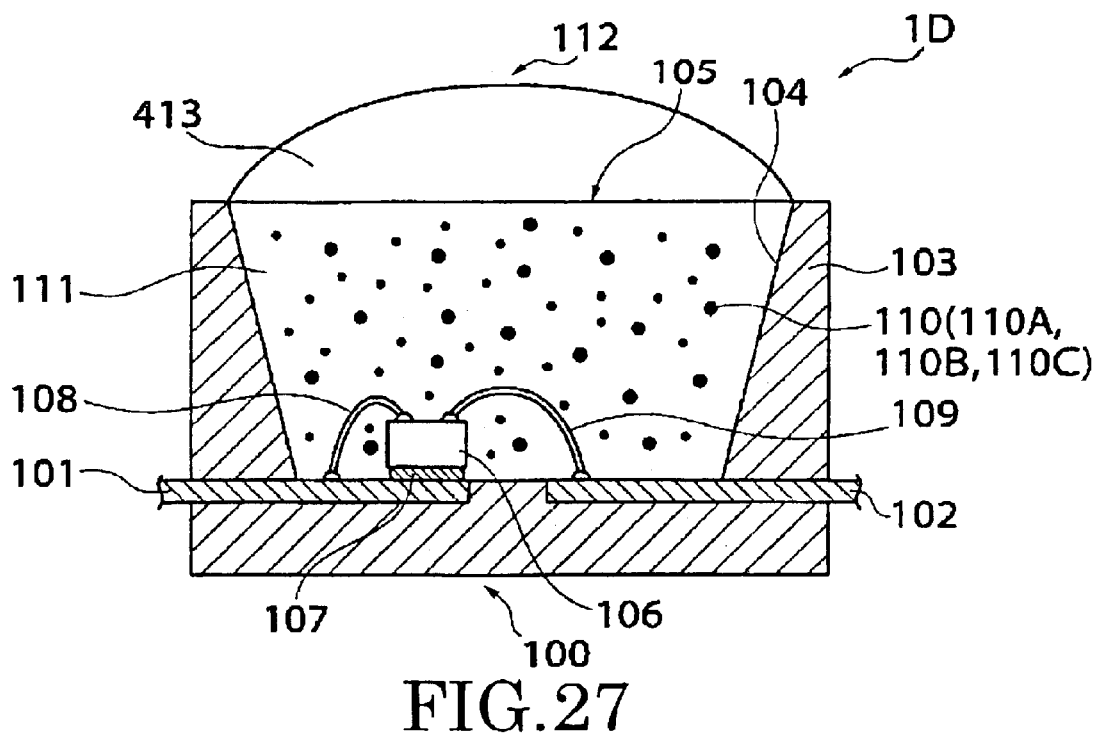
FIG. 27 is a diagram corresponding to FIG. 4, in which, however, the sealing element 111 contains a fluorescent element 110.
Figure 28:
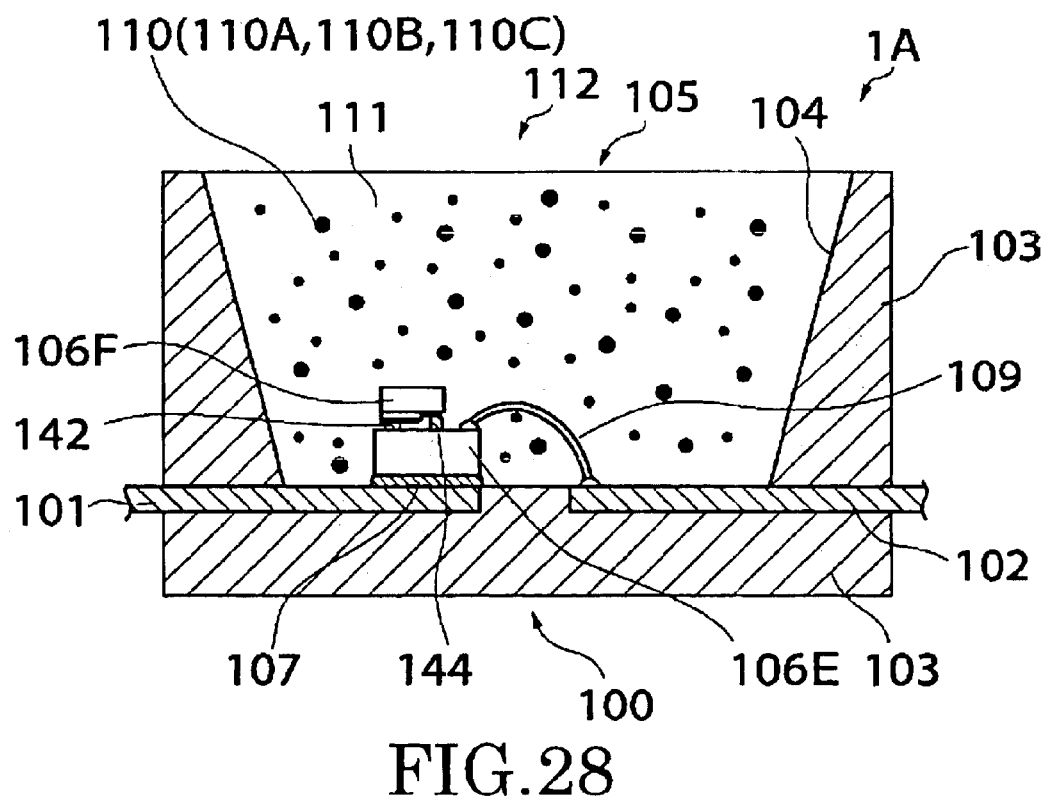
FIG. 28 is a diagram corresponding to FIG. 17, in which, however, the sealing element 111 contains a fluorescent element 110.
Figure 29:
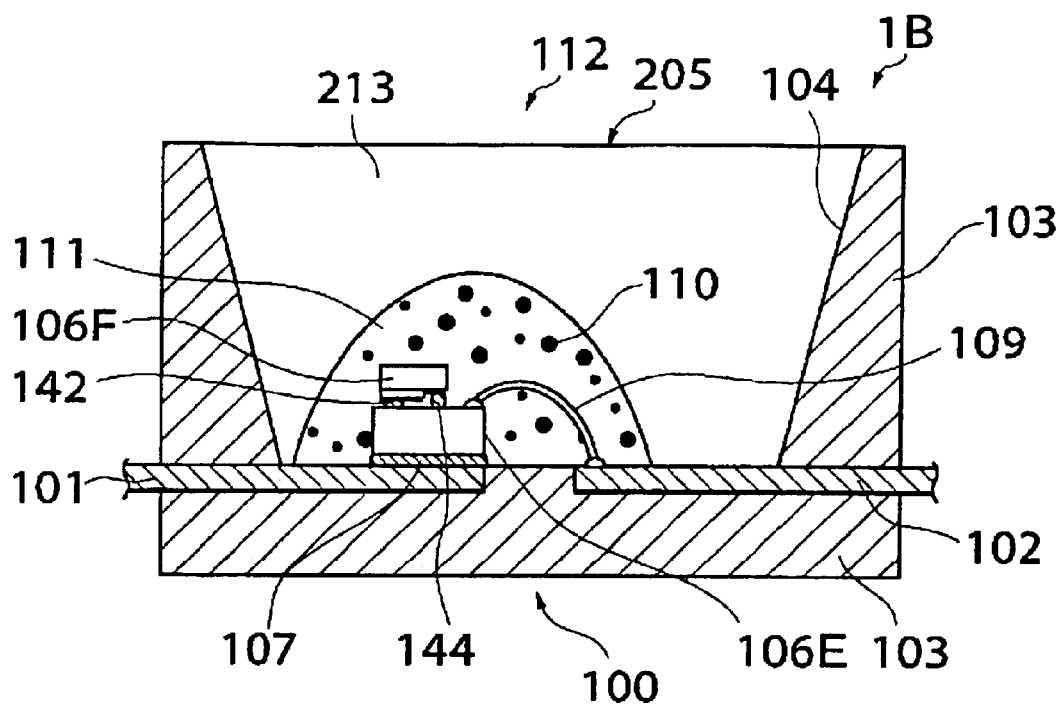
FIG. 29 is a diagram corresponding to FIG. 19, in which, however, the sealing element 111 contains a fluorescent element 110.
Figure 30:
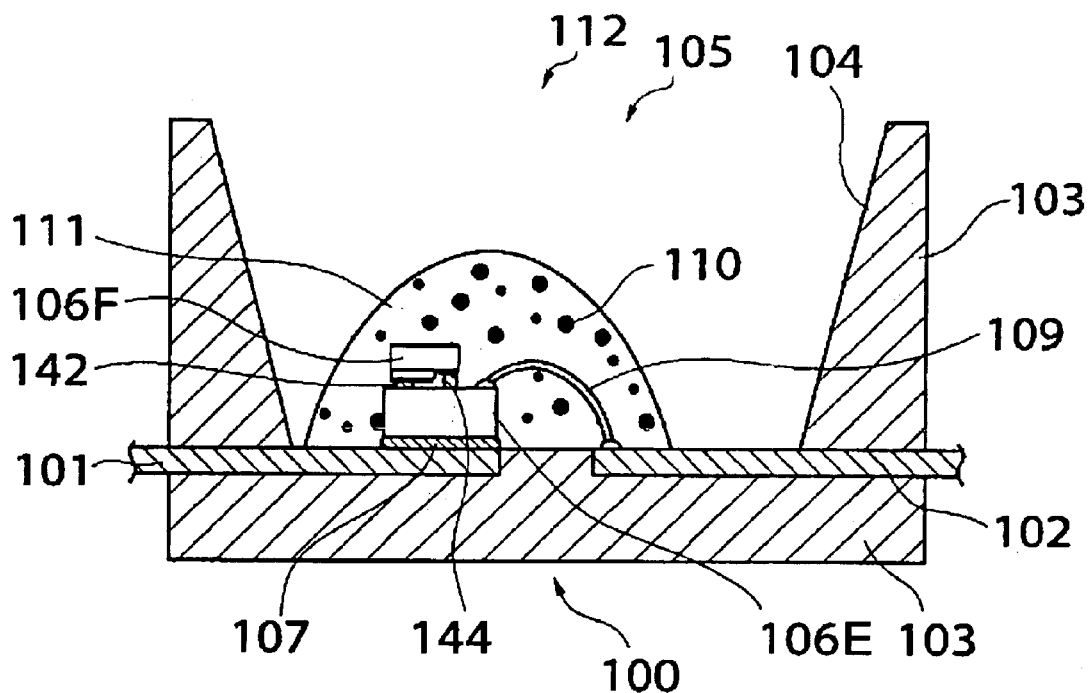
FIG. 30 is a diagram corresponding to FIG. 20, in which, however, the sealing element 111 contains a fluorescent element 110.
Figure 31:
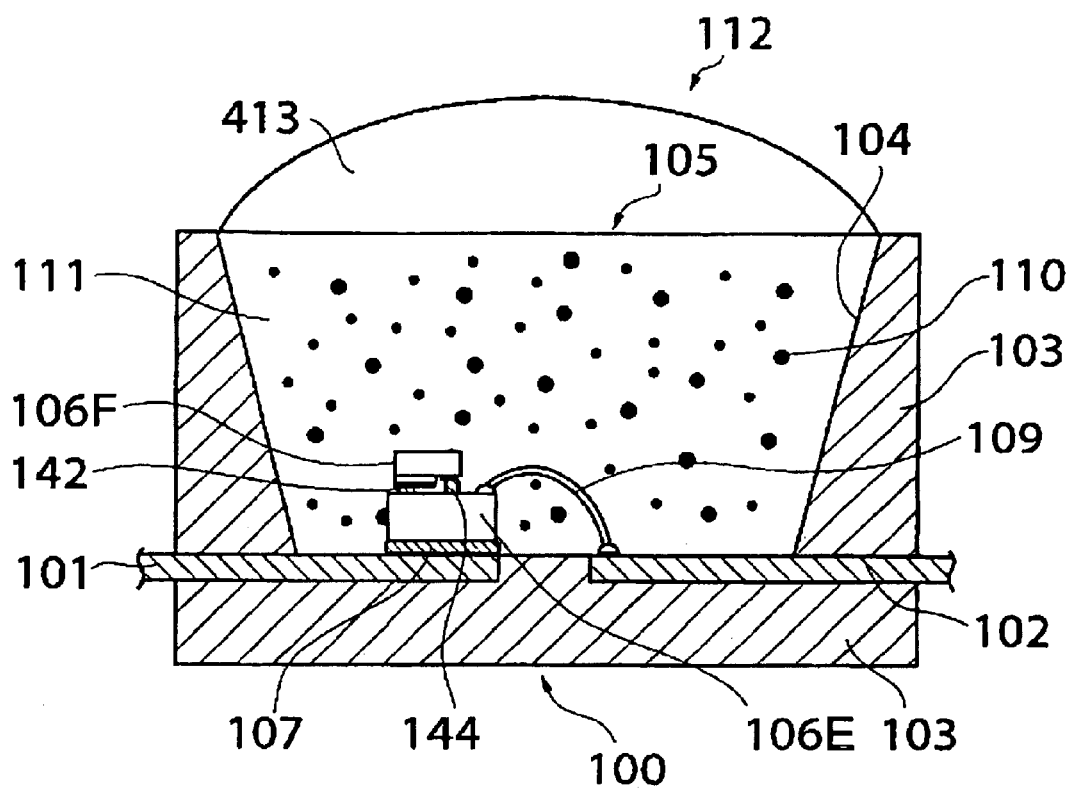
FIG. 31 is a diagram corresponding to FIG. 21, in which, however, the sealing element 111 contains a fluorescent element 110.

FIGS. 25 through 27 shows devices modified from the devices shown in FIGS. 2 through 4 to contain the fluorescent element 110 in the sealing element 111. Here again, the same or equivalent components as those already explained with reference to FIGS. 1A through 24 are commonly labeled, and their detailed explanation is omitted for simplicity. In the specific examples shown here, the fluorescent element 110 is a mixture of fluorescent elements 110A, 110B and 110C. However, the invention is not limited to this combination, but any other appropriate combination is also acceptable.

In this manner, by combining the fluorescent element with the light emitting device incorporating a plurality chips by making use of the unique opening shape and the unique chip layout pattern explained with reference to the first embodiment of the invention, it is possible to further improve the emission property and realize emission of any desired color.

FIGS. 28 through 31 shows devices modified from the devices shown in FIGS. 17 and 19 through 21 to contain the fluorescent element 110 in the sealing element 111. Here again, the same or equivalent components as those already explained with reference to FIGS. 1A through 27 are commonly labeled, and their detailed explanation is omitted for simplicity. Here again, the fluorescent element 110 is a mixture of fluorescent elements 110A, 110B and 110C. However, the invention is not limited to this combination, but any other appropriate combination is also acceptable.

In this manner, by combining the fluorescent element with the light emitting device incorporating a plurality of chips by making use of the unique structure of stacking chips as already explained with reference to the second embodiment of the invention, it is possible to realize a compact light emitting device further improved in emission characteristics while ensuring a high reliability.

The embodiment shown here is not limited to devices combining the fluorescent element with the sealing element 111 in the devices according to the first and second embodiments of the invention. Hereinbelow, some such other specific examples are introduced.

Figure 32:
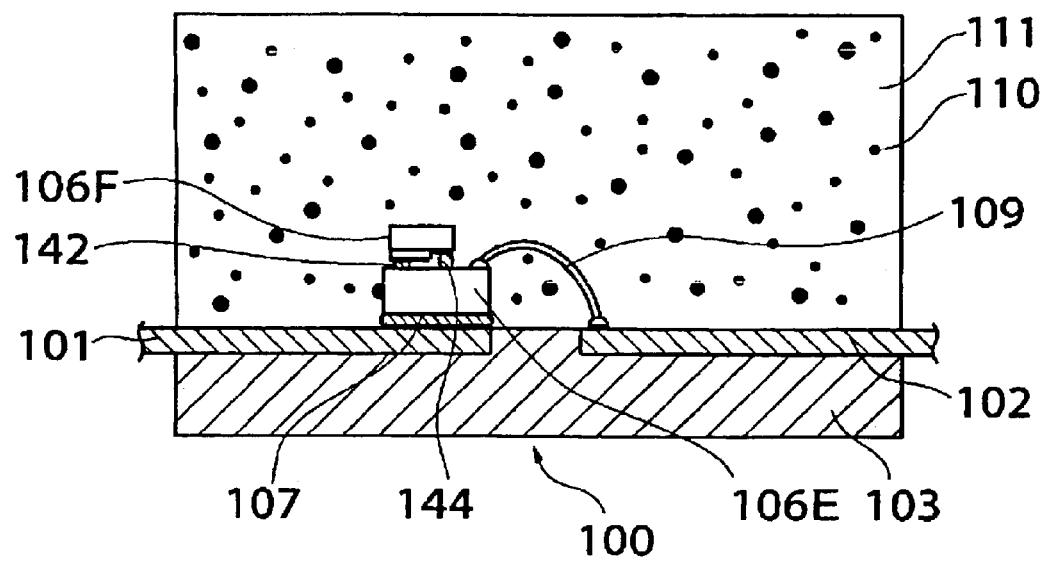
FIG. 32 is a cross-sectional view that schematically shows a configuration of the substantial part of a light emitting device as a specific example according to the third embodiment of the invention.

FIG. 32 is a cross-sectional view that schematically shows a configuration of the substantial part of a light emitting device according to another embodiment of the invention. Here again, the same or equivalent components as those already explained with reference to FIGS. 1A through 31 are commonly labeled, and their detailed explanation is omitted for simplicity.

The light emitting device shown here also includes a resin stem 100, a stacked structure including a protective diode 106E and a semiconductor light emitting element 106F mounted thereon, and sealing element 111 embedding the stacked structure. The sealing element 111 is made of silicone resin having a hardness in a range from 50 through 90 in JISA value. The florescent element 110 is included in the silicone resin.

In the instant embodiment, however, the resin portion 103 has no side wall around the sealing element 111 such that the secondary light from the fluorescent element 110 both upwardly and laterally to realize a wide luminous intensity profile. This is suitable for applications expected to provide a wide field of view or a wide field of emission.

Figure 33:
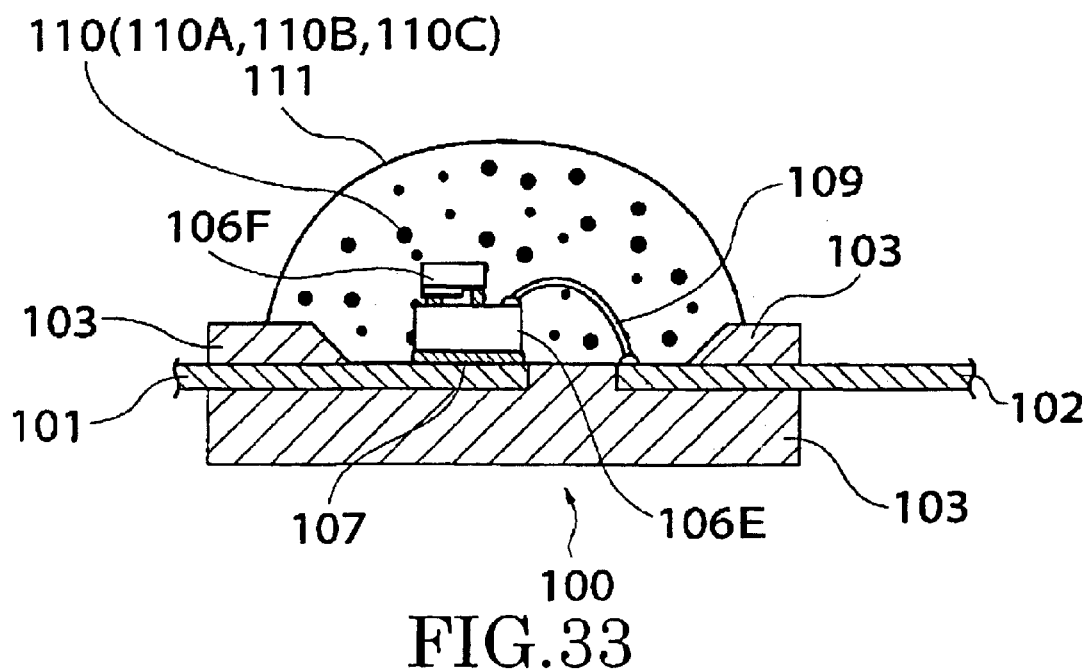
FIG. 33 is a cross-sectional view that shows a light emitting device having an approximately hemispherical sealing element 111 and a resin stem 100 including a resin portion 103 configured to bury leads 101, 102 and surround them with a low side wall.

Shapes of the sealing element and the resin stem 100 are not limited to those illustrated. For example, the sealing element may be hemispherical as shown in FIG. 33, and the resin stem 100 may have a resin portion 103 configured to bury the leads 101, 102 and surround the element with a low side wall.

Figure 34:
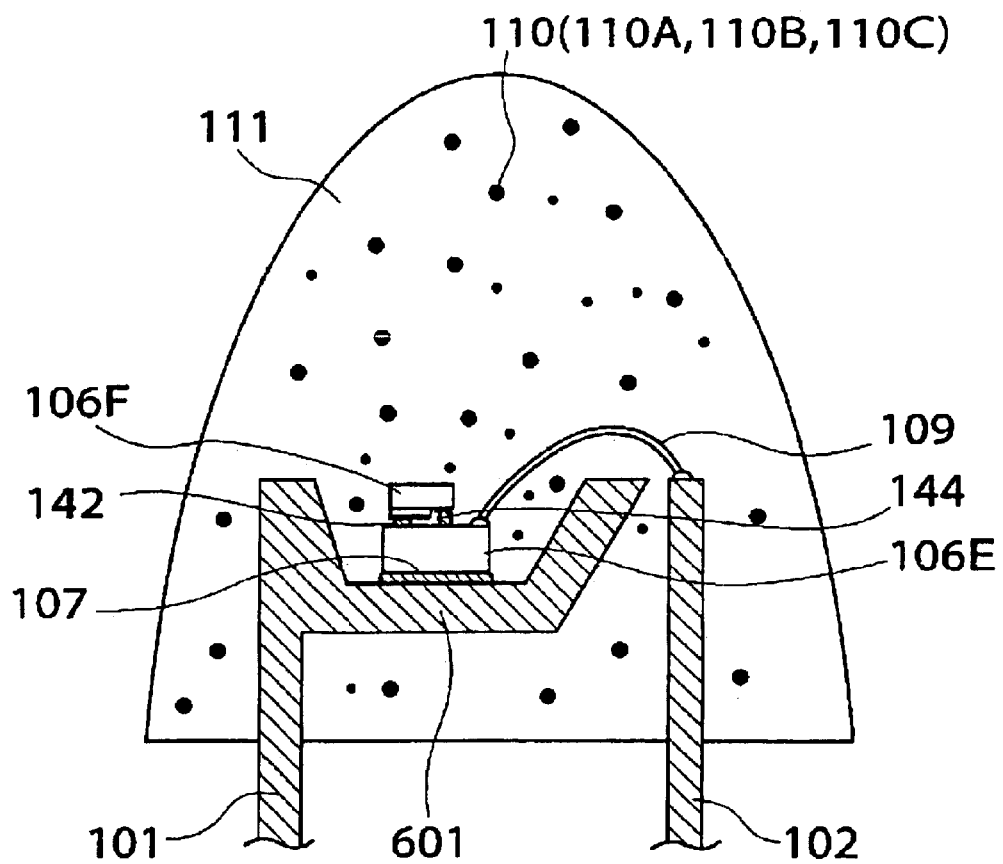
FIG. 34 is a cross-sectional view that schematically shows a configuration of the substantial part of a light emitting device as a specific example according to the third embodiment of the invention.

FIG. 34 is a cross-sectional view that schematically shows a configuration of the substantial part of a light emitting device according to an embodiment of the invention. Here again, the same or equivalent components as those already explained with reference to FIGS. 1A through 33 are commonly labeled, and their detailed explanation is omitted for simplicity.

The light emitting device shown here also includes a pair of leads 101, 102. However, the first lead 101 has formed a cup portion 601 at the distal end, and the stacked structure including the protective diode 106E and the light emitting element 106F is mounted at the bottom of the cup portion 601. Then the wire 109 extending from the diode 106E is connected to the lead 102. The sealing element 111 containing the fluorescent element 110 is formed to embed these components. The sealing element 111 is made of silicone resin having a hardness in a range from 50 through 90 in JISA value.

The inner side wall surface of the cup portion 601 serves as the reflective surface to reflect the primary light from the light emitting element 106 upwardly. In receipt of the primary light, the fluorescent element 110 releases secondary light of predetermined wavelengths.

The light emitting device shown here replaces conventional lamp-type semiconductor devices, and is operative as a general-purpose light emitting device having a relatively wide field of emission.

Figure 35:
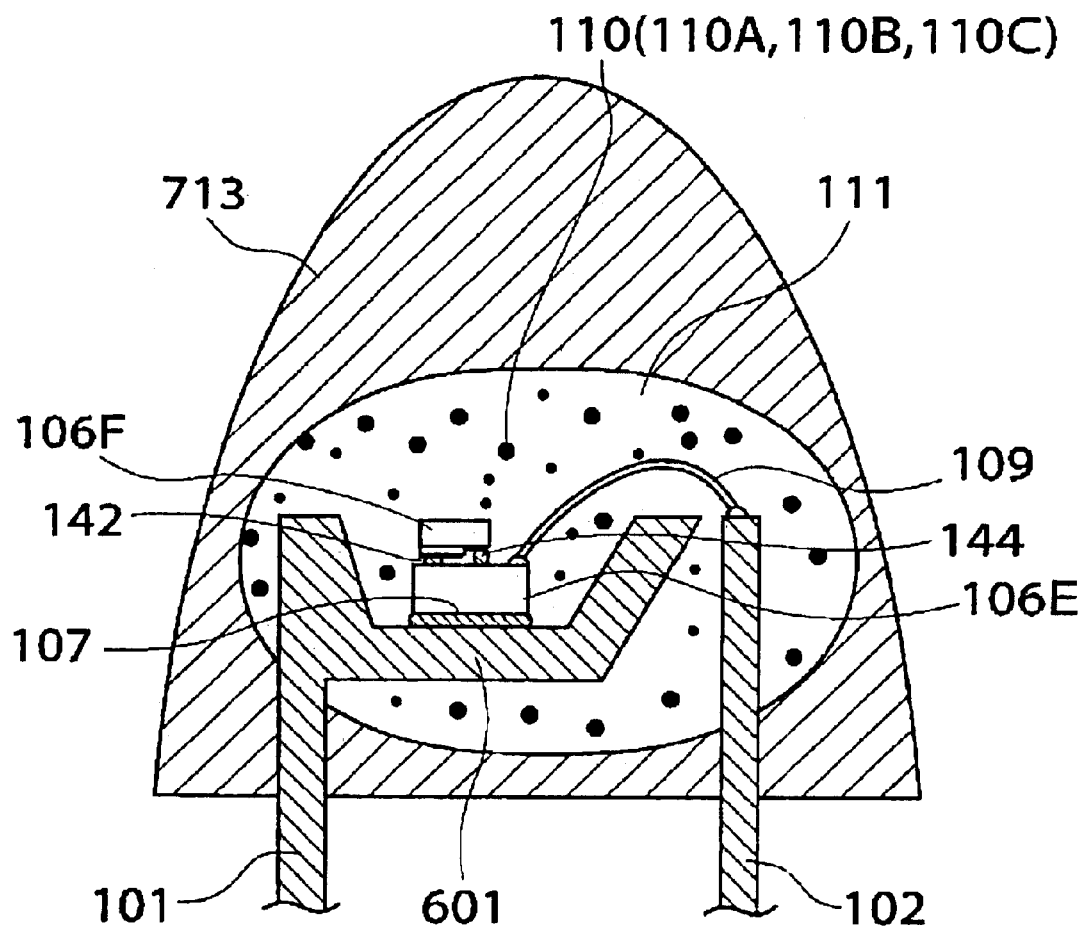
FIG. 35 is a cross-sectional view that schematically shows a configuration of the substantial part of a light emitting device as a specific example according to the third embodiment of the invention.

FIG. 35 is a cross-sectional view that schematically shows a configuration of the substantial part of a light emitting device according to another embodiment of the invention. Here again, the same or equivalent components as those already explained with reference to FIGS. 1A through 34 are commonly labeled, and their detailed explanation is omitted for simplicity.

The light emitting device shown here has a structure similar to the light emitting device shown in FIG. 34. The light emitting device also has a cup portion 601 at the distal end of the first lead 101, and the stacked structure including the protective diode 106E and the light emitting element 106F is mounted at the bottom thereof. Then the wire 109 from the diode 106F is connected to the lead 102. The sealing element 111 is made of silicone resin having a hardness in a range from 50 through 90 in JISA value. The sealing element 111 containing the fluorescent element 110 is provided to embed those components.

In the instant embodiment, however, the sealing element 111 is small-sized, and a transparent element 713 is provided to enclose the sealing element 111.

The small-sized sealing element 111 containing the fluorescent element 110 diminishes the emission portion and increases the luminance. The top surface of the transparent element 713 functions as a lens to gather rays of light, and makes it possible to extract converged light as well.

The transparent element 713 enclosing the sealing element 111 isolates the fluorescent element 110 from the outside atmosphere and improves its durability against moisture and corrosive atmosphere. The transparent element may be made of a resin. Especially, an epoxy resin or silicone resin is advantageous for close contact with the sealing element 111 to enhance the resistance to whether and the mechanical strength.

Figure 36:
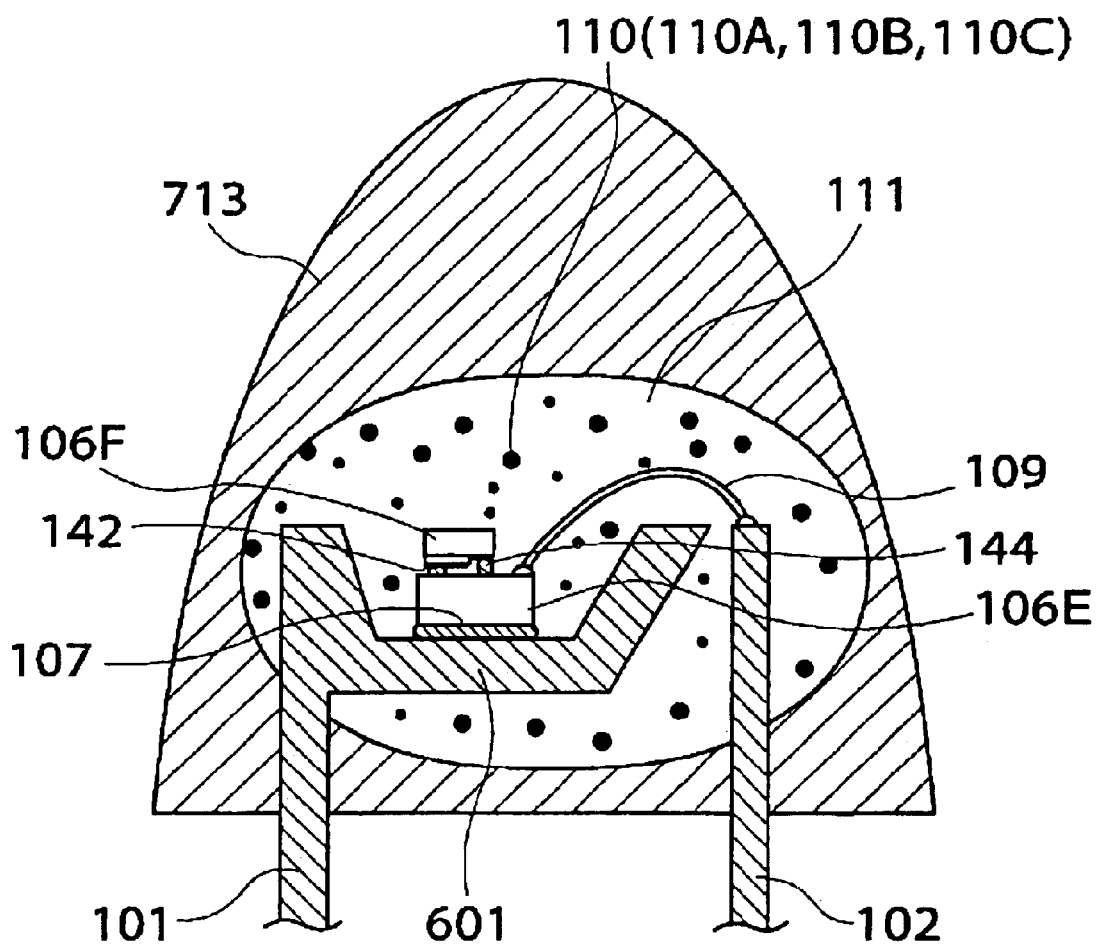
FIG. 36 is a cross-sectional view that shows a light emitting device in which the sealing element 111 containing the fluorescent element 110 is provided only in and on a cup portion 601.

The embodiment shown here is not limited to the illustrated example. For example, as shown in FIG. 36, the sealing element 111 containing the fluorescent element 110 may be limited only on the cup portion 601 to reduce the size of the emission portion and thereby increase the luminance. In this case, the wire 109 will extend beyond the boundary between the sealing element 111 and the transparent element 713. However, if the sealing element 111 and the transparent element 713 are made of similar materials, the stress at the boundary will be minimized and will prevent breakage of wire.

Heretofore, various embodiments of the invention have been explained with reference to specific examples. The invention, however, is not limited to those examples. Rather, the invention should be construed to include various changes and modifications an ordinary skilled person can make regarding, for example, the materials of the fluorescent elements, structures and materials of the light emitting element, shapes of the leads and the sealing element 111, dimensional relations among components, and so on.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A light emitting device comprising:

a lead;

a resin portion embedding at least a part of said lead;

a first semiconductor light emitting element mounted on said lead in an opening formed in said resin portion;

a semiconductor element mounted on said lead in said opening;

a wire connecting said first semiconductor light emitting element and said lead; and a silicone resin provided in said opening to enclose said first semiconductor light emitting element and said semiconductor element, said silicone resin having a hardness not lower than 50 in JISA value, said lead having a slit formed therein between a portion where said first semiconductor light emitting element is mounted and a portion where said wire is connected, while said portion where said first semiconductor light emitting element is mounted is electrically continuous with said portion where said wire is connected.

2. A light emitting device comprising:

a first lead;

a second lead;

a resin portion embedding at least a part of said first and second leads;

a first semiconductor light emitting element mounted on said first lead in an opening formed in said resin portion;

a semiconductor element mounted on said second lead in said opening;

a first wire connecting said first semiconductor light emitting element and said second lead;

a second wire connecting said semiconductor element and said first lead; and a silicone resin provided in said opening to enclose said first semiconductor light emitting element and said semiconductor element, said silicone resin having a hardness not lower than 50 in JISA value, said first lead having a first slit formed therein between a portion where said first semiconductor light emitting element is mounted and a portion where said second wire is connected, said second lead having a second slit formed therein between a portion where said semiconductor element is mounted and a portion where said first wire is connected.

3. A light emitting device according to claim 2, wherein said opening has a substantially elliptical or elongate-circular opening shape.

4. A light emitting device comprising:

a first lead;

a second lead;

a resin portion embedding at least a part of said first and second leads;

a first semiconductor light emitting element mounted on said first lead in an opening formed in said resin portion;

a semiconductor element mounted on said first lead in said opening;

a first wire connecting said first semiconductor light emitting element and said second lead;

a second wire connecting said semiconductor element and said second lead; and a silicone resin provided in said opening to enclose said first semiconductor light emitting element and said semiconductor element, said silicone resin having a hardness not lower than 50 in JISA value, said opening having a substantially elliptical or elongate-circular opening shape, said first semiconductor light emitting element and said semiconductor element being arranged along a longer axis or a shorter axis of said elliptical or elongate-circular opening.

5. A light emitting device according to claim 4, further comprising a third wire connecting said first semiconductor light emitting element and said first lead, wherein said first lead having a slit formed therein between a portion where said first semiconductor light emitting element is mounted and a portion where said third wire is connected.

6. A light emitting device according to claim 1, wherein said first semiconductor light emitting element is placed in a center of said opening.

7. A light emitting device according to claim 1, wherein said silicone resin is provided to enclose said wire as well.

8. A light emitting device according to claim 2, wherein said semiconductor element is a second semiconductor light emitting element.

9. A light emitting device according to claim 8, wherein said first semiconductor light emitting element and said second semiconductor light emitting element are different in peak wavelength of light they emit.

10. A light emitting device according to claim 2, further comprising a fluorescent element which is included in said silicone resin, absorbs light emitted from said first semiconductor light emitting element and releases light of a peak wavelength different from said light from said first semiconductor light emitting element.

11. A light emitting device according to claim 2, wherein said silicone resin has a pre-curing viscosity in the range not lower than 100 cp and not higher than 10000 cp.

12. A light emitting device according to claim 2, wherein said silicone resin has a convex surface configuration.

13. A light emitting device according to claim 2, wherein said silicone resin has a hardness not higher than 90 in JISA value.

14. A light emitting device according to claim 4, wherein said semiconductor element is a second semiconductor light emitting element.

15. A light emitting device according to claim 14, wherein said first semiconductor light emitting element and said second semiconductor light emitting element are different in peak wavelength of light they emit.

16. A light emitting device according to claim 4, further comprising a fluorescent element which is included in said silicon resin, absorbs light emitted from said first semiconductor light emitting element and releases light of a peak wavelength different from said light from said first semiconductor light emitting element.

17. A light emitting device according to claim 4, wherein said silicone resin has a pre-curing viscosity in the range not lower than 100 cp and not higher than 10000 cp.

18. A light emitting device according to claim 4, wherein said silicone resin has a convex surface configuration.

19. A light emitting device according to claim 4, wherein said silicone resin has a hardness not higher than 90 in JISA value.

* * * * *